(12) United States Patent
Takeda et al.

(10) Patent No.: US 12,555,752 B2
(45) Date of Patent: Feb. 17, 2026

(54) SUBSTRATE PROCESSING APPARATUS, ELECTRODE STRUCTURE AND METHOD OF MANUFACTURING SEMICONDUCTOR DEVICE

(71) Applicant: Kokusai Electric Corporation, Tokyo (JP)

(72) Inventors: Tsuyoshi Takeda, Toyama (JP); Daisuke Hara, Toyama (JP); Hiroshi Nakajo, Toyama (JP); Iichiro Tsuchikura, Toyama (JP)

(73) Assignee: Kokusai Electric Corporation, Tokyo (JP)

( * ) Notice: Subject to any disclaimer, the term of this patent is extended or adjusted under 35 U.S.C. 154(b) by 282 days.

(21) Appl. No.: 18/171,015

(22) Filed: Feb. 17, 2023

(65) Prior Publication Data
US 2023/0307212 A1   Sep. 28, 2023

(30) Foreign Application Priority Data
Mar. 23, 2022 (JP) .................. 2022-046320

(51) Int. Cl.
*H01J 37/32*  (2006.01)

(52) U.S. Cl.
CPC .. *H01J 37/32568* (2013.01); *H01J 37/32091* (2013.01); *H01J 37/32449* (2013.01); *H01J 37/32522* (2013.01); *H01J 37/32541* (2013.01)

(58) Field of Classification Search
None
See application file for complete search history.

(56) References Cited

U.S. PATENT DOCUMENTS

| 11,804,365 B2* | 10/2023 | Takeda ............ H01J 37/32568 |
| 12,094,735 B2* | 9/2024 | Takeda ............ H01J 37/32532 |

(Continued)

FOREIGN PATENT DOCUMENTS

| JP | 59-156426 A | 9/1984 |
| JP | 2007324477 A | 12/2007 |

(Continued)

OTHER PUBLICATIONS

Notice of Reasons for Refusal with English translation in Japanese Application No. 2022-046320, dated Apr. 5, 2024, 6 pages.

(Continued)

*Primary Examiner* — Srinivas Sathiraju
(74) *Attorney, Agent, or Firm* — Edell, Shapiro & Finnan, LLC

(57) ABSTRACT

According to the present disclosure, there is provided a technique capable of performing a substrate processing more uniformly. According to one aspect thereof, there is provided an electrode structure capable of generating a plasma, including: a first electrode group constituted by: at least one first electrode to which an electric potential is applied; at least one second electrode whose length is different from that of the first electrode and to which an electric potential is applied; and at least one third electrode to which a reference potential is applied; and a second electrode group constituted by: at least one fourth electrode to which an electric potential is applied; at least one fifth electrode whose length is different from that of the fourth electrode and to which an electric potential is applied; and at least one sixth electrode to which the reference potential is applied.

20 Claims, 7 Drawing Sheets

(56) References Cited

U.S. PATENT DOCUMENTS

| | | | | |
|---|---|---|---|---|
| 2006/0150911 | A1* | 7/2006 | Miyairi | F01N 3/2013<br>156/345.43 |
| 2015/0303051 | A1* | 10/2015 | Takeda | C23C 16/52<br>438/758 |
| 2016/0233085 | A1* | 8/2016 | Yamaguchi | C23C 16/30 |
| 2021/0180185 | A1* | 6/2021 | Hara | C23C 16/45574 |
| 2021/0183670 | A1* | 6/2021 | Hara | C23C 16/509 |
| 2022/0181125 | A1* | 6/2022 | Takeda | H01L 21/31 |
| 2022/0277938 | A1* | 9/2022 | Imamura | H01L 21/263 |
| 2022/0301898 | A1* | 9/2022 | Takeda | H01L 21/67098 |
| 2023/0175116 | A1* | 6/2023 | Nakatani | C23C 16/042<br>427/255.28 |
| 2023/0183864 | A1* | 6/2023 | Yamamoto | C23C 16/04<br>118/724 |
| 2023/0187179 | A1* | 6/2023 | Takeda | H01J 37/32449<br>315/111.21 |
| 2023/0187180 | A1* | 6/2023 | Ejiri | H01L 21/67109<br>427/569 |
| 2023/0187188 | A1* | 6/2023 | Takeda | H01J 37/32568<br>427/569 |
| 2023/0187243 | A1* | 6/2023 | Shibata | H01L 21/67778<br>438/5 |
| 2023/0189407 | A1* | 6/2023 | Yamamoto | H01L 21/31<br>438/795 |
| 2023/0191449 | A1* | 6/2023 | Takano | H01L 21/67063<br>438/689 |
| 2023/0193465 | A1* | 6/2023 | Tateno | C23C 16/45502<br>118/719 |
| 2023/0197408 | A1* | 6/2023 | Takeda | H01J 37/321<br>438/478 |
| 2023/0207261 | A1* | 6/2023 | Hara | H01J 37/32568<br>315/111.21 |
| 2023/0207310 | A1* | 6/2023 | Hanashima | H01L 21/0228<br>438/778 |
| 2023/0207335 | A1* | 6/2023 | Sambu | C23C 16/4583<br>118/728 |
| 2023/0215724 | A1* | 7/2023 | Nishida | H01L 21/02274<br>438/770 |
| 2023/0221700 | A1* | 7/2023 | Yamaguchi | H01L 21/67098<br>700/121 |
| 2023/0223247 | A1* | 7/2023 | Ikeda | C23C 16/4405<br>134/21 |
| 2023/0227979 | A1* | 7/2023 | Sasaki | C23C 16/52<br>118/715 |
| 2023/0287567 | A1* | 9/2023 | Nakatani | H01L 21/02274 |
| 2023/0307212 | A1* | 9/2023 | Takeda | H01J 37/32091 |

FOREIGN PATENT DOCUMENTS

| | | |
|---|---|---|
| JP | 2020-43221 A | 3/2020 |
| WO | 2021/044504 A1 | 3/2021 |

OTHER PUBLICATIONS

Notice of Reasons for Refusal with English translation in Japanese Application No. 2022-046320, dated Jan. 19, 2024, 4 pages.

TIPO Office Action with English translation in Taiwan Application No. 111149245, dated Jan. 25, 2024, 13 pages.

* cited by examiner

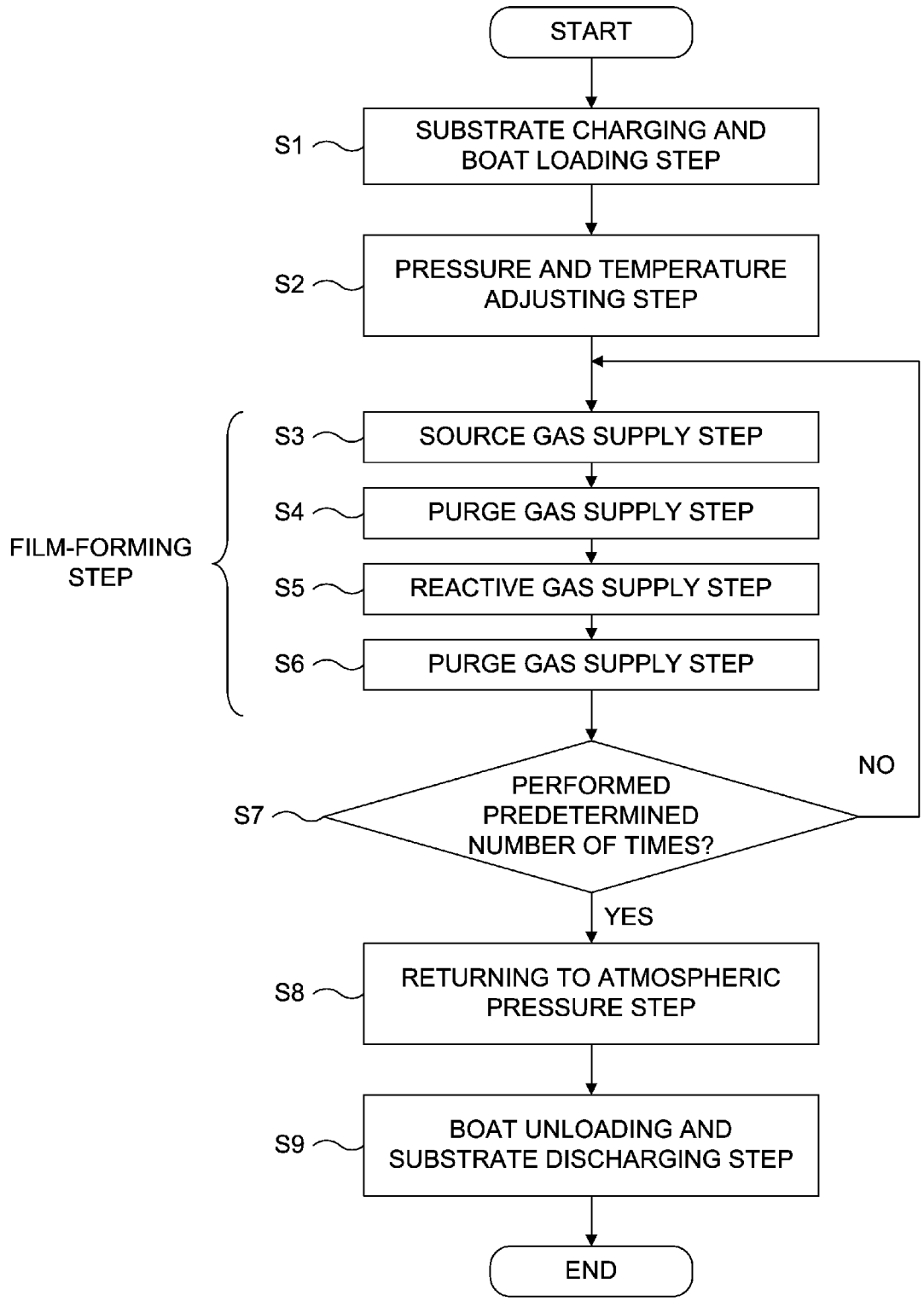

SUBSTRATE PROCESSING APPARATUS, ELECTRODE STRUCTURE AND METHOD OF MANUFACTURING SEMICONDUCTOR DEVICE

CROSS REFERENCE TO RELATED APPLICATIONS

This application claims foreign priority under 35 U.S.C. § 119(a)-(d) to Application No. JP 2022-046320 filed on Mar. 23, 2022, the entire contents of which are hereby incorporated by reference.

TECHNICAL FIELD

The present disclosure relates to a substrate processing apparatus, an electrode structure and a method of manufacturing a semiconductor device.

BACKGROUND

As a part of a manufacturing process of a semiconductor device, a substrate processing may be performed. According to the substrate processing, various films such as an insulating film, a semiconductor film and a conductor film may be formed on a substrate or may be removed from the substrate by loading (transferring) the substrate into a process chamber of a substrate processing apparatus and supplying a source gas and a reactive gas into the process chamber.

In a mass-produced device in which a fine pattern is formed, the substrate processing may be performed at a lower temperature such that a diffusion of impurities can be suppressed or a low heat resistance material such as an organic material can be used.

In order to address such a problem described above, the substrate processing by using a plasma is generally performed. However, in such a substrate processing, it may become difficult to uniformly process the films described above.

SUMMARY

According to the present disclosure, there is provided a technique capable of performing a substrate processing more uniformly.

According to an aspect of the technique of the present disclosure, there is provided an electrode structure capable of generating a plasma, the electrode structure including: a first electrode group constituted by: at least one first electrode to which at least one electric potential is applied; at least one second electrode, each of whose length is different from that of the first electrode, and to which at least one electric potential is applied; and at least one third electrode to which a reference potential is applied; and a second electrode group constituted by: at least one fourth electrode to which at least one electric potential is applied; at least one fifth electrode, each of whose length is different from that of the fourth electrode, and to which at least one electric potential is applied; and at least one sixth electrode to which the reference potential is applied.

BRIEF DESCRIPTION OF THE DRAWINGS

FIG. 3A is a perspective view when the electrode structure according to the embodiments of the present disclosure is installed in an electrode fixture, and FIG. 3B is a diagram schematically illustrating a positional relationship among a heater, the electrode fixture, the electrode structure, a protrusion for fixing the electrode structure and a reaction tube according to the embodiments of the present disclosure.

FIG. 4A is a perspective view when the electrode structure according to the first modified example of the embodiments of the present disclosure is installed in an electrode fixture, and FIG. 4B is a diagram schematically illustrating a positional relationship among the heater, the electrode fixture, the electrode structure, the protrusion for fixing the electrode structure and the reaction tube according to the first modified example of the embodiments of the present disclosure.

FIG. 5A is a front view of the electrode structure according to the embodiments of the present disclosure, and FIG. 5B is a diagram schematically illustrating a state in which the electrode structure is fixed to the electrode fixture.

FIG. 7 is a flow chart schematically illustrating an example of a substrate processing performed by using the substrate processing apparatus shown in FIG. 1.

DETAILED DESCRIPTION

Embodiments of Present Disclosure

Figure 1:
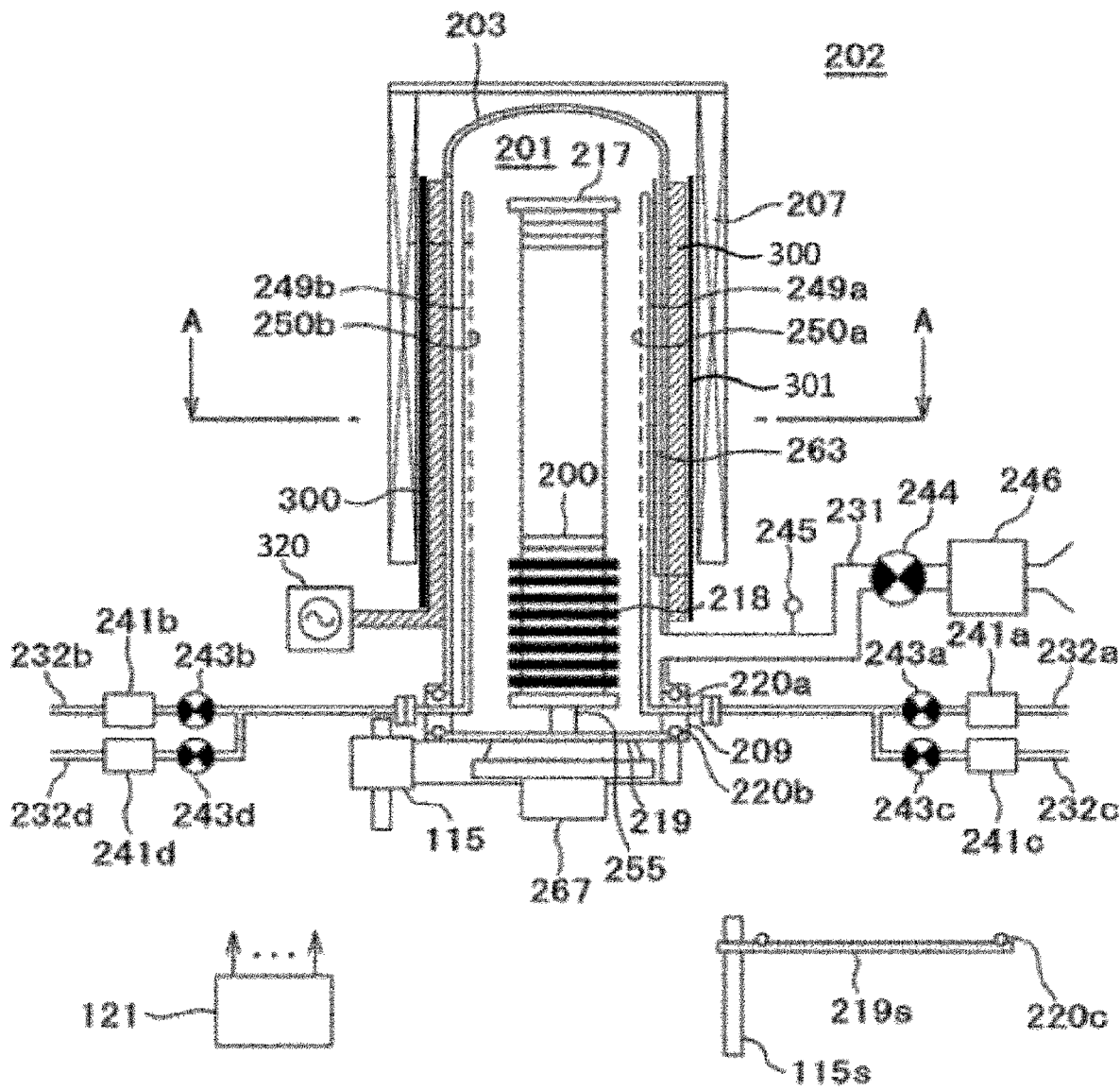
FIG. 1 is a diagram schematically illustrating a vertical cross-section of a vertical type process furnace of a substrate processing apparatus preferably used in one or more embodiments of the present disclosure.

Hereinafter, one or more embodiments (also simply referred to as "embodiments") of the technique of the present disclosure will be described in detail with reference to FIGS. 1 through 7. The drawings used in the following descriptions are all schematic. For example, a relationship between dimensions of each component and a ratio of each component shown in the drawing may not always match the actual ones. Further, even between the drawings, the relationship between the dimensions of each component and the ratio of each component may not always match.

(1) Configuration of Substrate Processing Apparatus

<Heater>

As shown in FIG. 1, a vertical type substrate processing apparatus according to the present embodiments includes a vertical type process furnace (also simply referred to as a "process furnace) 202. The process furnace 202 includes a heater 207 serving as a heating apparatus (which is a heating structure or a heating system). The heater 207 is of a cylindrical shape, and is vertically installed while being supported by a support plate (not shown). The heater 207 also functions as an activator (also referred to as an "exciter") capable of activating (or exciting) a gas by a heat.

<Process Chamber>

An electrode fixture 301 described later is provided in an inner side of the heater 207, and an electrode structure 300 of a plasma generator (which is a plasma generating structure) described later is provided in an inner side of the electrode fixture 301. Further, a reaction tube 203 is provided in an inner side of the electrode structure 300 to be aligned in a manner concentric with the heater 207. For example, the reaction tube 203 is made of a heat resistant material such as quartz ($SiO_2$) and silicon carbide (SiC). The reaction tube 203 is of a cylindrical shape with a closed upper end and an open lower end. A manifold 209 is provided under the reaction tube 203 to be aligned in a manner concentric with the reaction tube 203. For example, the manifold 209 is made of a metal material such as stainless steel (SUS). The manifold 209 is of a cylindrical shape with open upper and lower ends. An upper end portion of the manifold 209 is engaged with a lower end portion of the reaction tube 203 so as to support the reaction tube 203. An O-ring 220a serving as a seal is provided between the manifold 209 and the reaction tube 203. The reaction tube 203 is installed vertically while the manifold 209 is being supported by a heater base (not shown). A process vessel (also referred to as a "reaction vessel") is constituted mainly by the reaction tube 203 and the manifold 209. A process chamber 201 is provided in a hollow cylindrical portion of the process vessel. The process chamber 201 is configured to accommodate a plurality of wafers including a wafer 200 serving as a substrate. Hereinafter, the plurality of wafers including the wafer 200 may also be simply referred to as "wafers 200". However, the process vessel is not limited to the configuration described above. For example, the reaction tube 203 alone may also be referred to as the "process vessel".

<Gas Supplier>

Nozzles 249a and 249b are provided in the process chamber 201 so as to penetrate a side wall of the manifold 209. The nozzles 249a and 249b serve as a first supplier (which is a first supply structure) and a second supplier (which is a second supply structure), respectively. The nozzles 249a and 249b may also be referred to as a first nozzle and a second nozzle, respectively. For example, each of the nozzles 249a and 249b is made of a heat resistant material such as quartz and SiC. Gas supply pipes 232a and 232b are connected to the nozzles 249a and 249b, respectively. For example, as described above, two nozzles 249a and 249b and two gas supply pipes 232a and 232b are provided at the process vessel such that a plurality types of gases can be supplied into the process chamber 201 via the nozzles 249a and 249b and the gas supply pipes 232a and 232b. Further, when the reaction tube 203 alone constitutes the process vessel, the nozzles 249a and 249b may be provided in the process chamber 201 so as to penetrate a side wall of the reaction tube 203.

Mass flow controllers (also simply referred to as "MFCs") 241a and 241b serving as flow rate controllers (flow rate control structures) and valves 243a and 243b serving as opening/closing valves are sequentially installed at the gas supply pipes 232a and 232b, respectively, in this order from upstream sides to downstream sides of the gas supply pipes 232a and 232b in a gas flow direction. Gas supply pipes 232c and 232d through which an inert gas is supplied are connected to the gas supply pipes 232a and 232b at a downstream side of the valve 243a of the gas supply pipe 232a and a downstream side of the valve 243b of the gas supply pipe 232b, respectively. MFCs 241c and 241d and valves 243c and 243d are sequentially installed at the gas supply pipes 232c and 232d, respectively, in this order from upstream sides to downstream sides of the gas supply pipes 232c and 232d in the gas flow direction.

Figure 2:
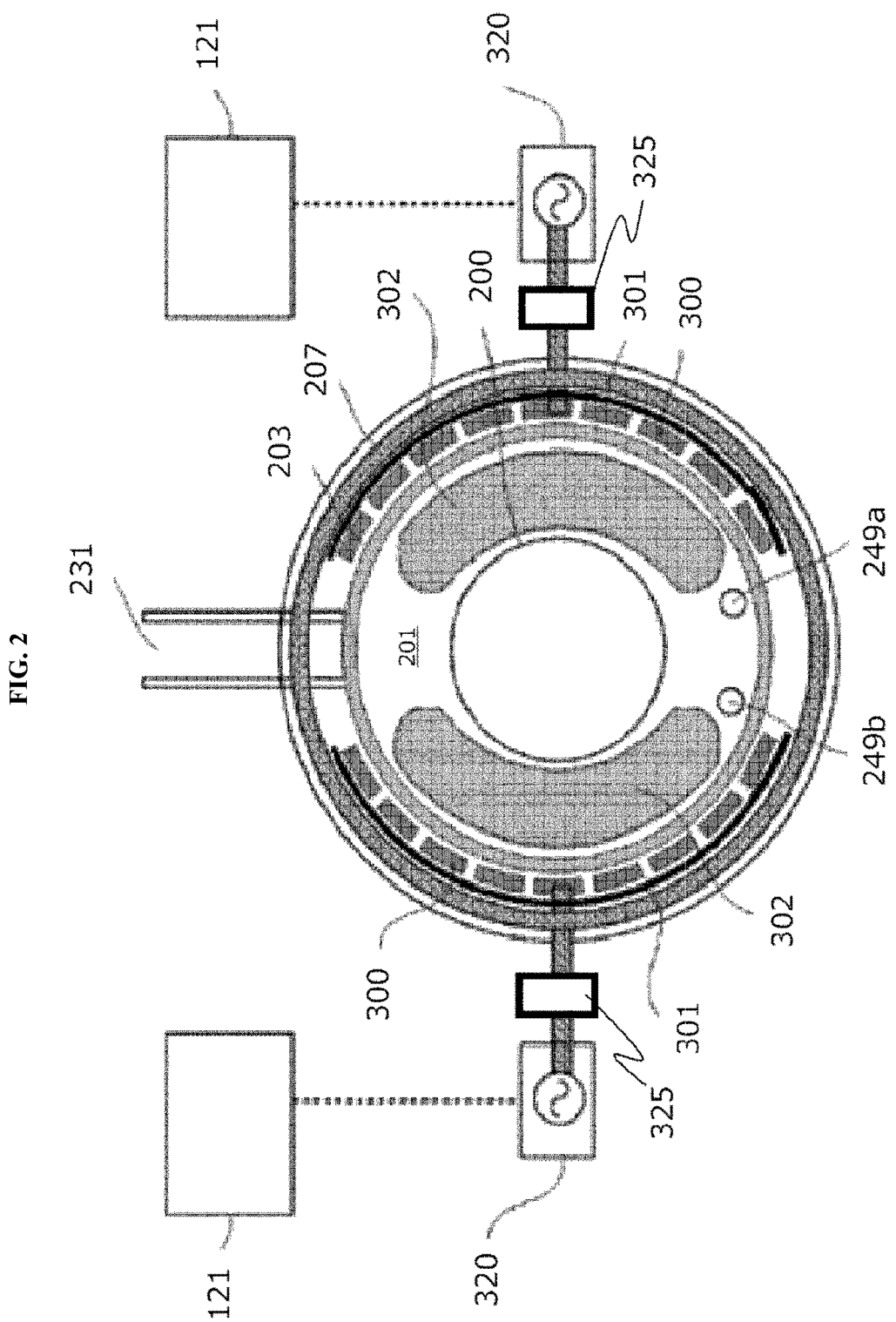
FIG. 2 is a diagram schematically illustrating a horizontal cross-section taken along a line A-A of the substrate processing apparatus shown in FIG. 1.

As shown in FIGS. 1 and 2, each of the nozzles 249a and 249b is installed in an annular space provided between an inner wall of the reaction tube 203 and the wafers 200 when viewed from above, and extends upward from a lower portion toward an upper portion of the reaction tube 203 along the inner wall of the reaction tube 203 (that is, extends upward along a stacking direction of the wafers 200). That is, each of the nozzles 249a and 249b is installed in a region that is located beside and horizontally surrounds a wafer arrangement region in which the wafers 200 are arranged (stacked) to extend along the wafer arrangement region. That is, the nozzles 249a and 249b are provided beside edges (peripheries) of the wafers 200 loaded into the process chamber 201, and are provided perpendicular to surfaces (flat surfaces) of the wafers 200. A plurality of gas supply holes 250a and a plurality of gas supply holes 250b are provided at side surfaces of the nozzles 249a and 249b, respectively. Gases are supplied through the gas supply holes 250a and the gas supply holes 250b, respectively. The gas supply holes 250a and the gas supply holes 250b are open toward a center of the reaction tube 203, and are configured such that the gases are supplied toward the wafers 200 through the gas supply holes 250a and the gas supply holes 250b. The gas supply holes 250a and the gas supply holes 250b are provided from the lower portion toward the upper portion of the reaction tube 203.

According to the present embodiments, the gases such as a source gas and a reactive gas are respectively supplied through the nozzles 249a and 249b, which are provided in a vertical annular space (that is, a cylindrical space) when viewed from above defined by an inner surface of the side wall (that is, the inner wall) of the reaction tube 203 and the edges (peripheries) of the wafers 200 arranged in the reaction tube 203. Then, the gases are respectively ejected into the reaction tube 203 in the vicinity of the wafers 200 first through the gas supply holes 250a and the gas supply holes 250b of the nozzles 249a and 249b. Each of the gases ejected into the reaction tube 203 mainly flows parallel to the surfaces of the wafers 200, that is, in a horizontal direction. Thereby, it is possible to uniformly supply the gases to each of the wafers 200, and it is also possible to improve a thickness uniformity of a film formed on each of the wafers 200. After flowing over the surfaces of the wafers 200, the gas (for example, a residual gas remaining after the reaction) flows toward an exhaust port, that is, toward an exhaust pipe 231 described later. However, a flow direction of the residual gas may be determined appropriately depending on a location of the exhaust port, and is not limited to the vertical direction.

A source material (that is, the source gas) is supplied into the process chamber 201 through the gas supply pipe 232a provided with the MFC 241a and the valve 243a and the nozzle 249a.

A reactant (that is, the reactive gas) is supplied into the process chamber 201 through the gas supply pipe 232b provided with the MFC 241b and the valve 243b and the nozzle 249b. For example, an oxygen (O)-containing gas may be used as the reactive gas.

The inert gas is supplied into the process chamber 201 through the gas supply pipes 232c and 232d provided with the MFCs 241c and 241d and the valves 243c and 243d, respectively, and the nozzles 249a and 249b.

For example, a source gas supplier (which is a source gas supply structure or a source gas supply system) serving as a first gas supplier (which is a first gas supply structure or a first gas supply system) is constituted mainly by the gas supply pipe 232a, the MFC 241a and the valve 243a. A reactive gas supplier (which is a reactive gas supply structure or a reactive gas supply system) serving as a second gas supplier (which is a second gas supply structure or a second gas supply system) is constituted mainly by the gas supply pipe 232b, the MFC 241b and the valve 243b. An inert gas supplier (which is an inert gas supply structure or an inert gas supply system) is constituted mainly by the gas supply pipes 232c and 232d, the MFCs 241c and 241d and the valves 243c and 243d. The source gas supplier, the reactive gas supplier and the inert gas supplier may be collectively referred to as a gas supplier (which is a gas supply structure or a gas supply system).

<Substrate Support>

As shown in FIG. 1, a boat 217 (which is a substrate support or a substrate retainer) is configured to accommodate (or support) the wafers 200 (for example, 25 to 200 wafers) along the vertical direction while the wafers 200 are horizontally oriented with their centers aligned with one another with a predetermined interval therebetween in a multistage manner. For example, the boat 217 is made of a heat resistant material such as quartz and SiC. A plurality of heat insulating plates 218 horizontally oriented are provided under the boat 217 in a multistage manner. Each of the heat insulating plates 218 is made of a heat resistant material such as quartz and SiC. With such a configuration, the heat insulating plates 218 suppress the transmission of the heat from the heater 207 to a seal cap 219 described later. However, the present embodiments are not limited thereto. For example, instead of the heat insulating plates 218, a heat insulating cylinder (not shown) such as a cylinder made of a heat resistant material such as quartz and SiC may be provided under the boat 217.

<Plasma Generator>

Subsequently, the plasma generator will be described with reference to FIGS. 1 to 5B.

The electrode structure 300 for generating a plasma is provided outside the reaction tube 203, that is, outside the process vessel (process chamber 201). The electrode structure 300 is configured such that, by applying a power to the electrode structure 300, the gas inside the reaction tube 203 (that is, inside the process vessel (process chamber 201)) can be plasmatized and excited, that is, the gas can be excited into a plasma state. For example, by exciting the gas into the plasma state by simply applying the electric power to the electrode structure 300, a capacitively coupled plasma (abbreviated as CCP) serving as the plasma is generated inside the reaction tube 203, that is, inside the process vessel (process chamber 201).

Specifically, as shown in FIG. 2, the electrode structure 300 and the electrode fixture 301 configured to fix the electrode structure 300 are arranged between the heater 207 and the reaction tube 203. As described above, the electrode fixture 301 is provided in the inner side of the heater 207, and the electrode structure 300 is provided in the inner side of the electrode fixture 301. Further, the reaction tube 203 is provided in the inner side of the electrode structure 300.

In addition, as shown in FIGS. 1 and 2, each of the electrode structure 300 and the electrode fixture 301 is installed in an annular space provided between an inner wall of the heater 207 and an outer wall of the reaction tube 203 when viewed from above, and extends upward from the lower portion toward the upper portion of the reaction tube 203 along the outer wall of the reaction tube 203 (that is, extends upward along an arrangement direction of the wafers 200). The electrode structure 300 is provided parallel to the nozzles 249a and 249b. The electrode structure 300 and the electrode fixture 301 are arranged to be aligned in a manner concentric with the reaction tube 203 and the heater 207, and are not in contact with the heater 207 when viewed from above. For example, the electrode fixture 301 is made of an insulating material (insulator), and is provided so as to cover at least a part of the electrode structure 300 and the reaction tube 203. Therefore, the electrode fixture 301 may also be referred to as a "cover" (which is a quartz cover, an insulating wall or an insulating plate) or a "cover with an arc-shaped cross-section" (which is a body with an arc-shaped cross-section or a wall with an arc-shaped cross-section).

Figure 3A:
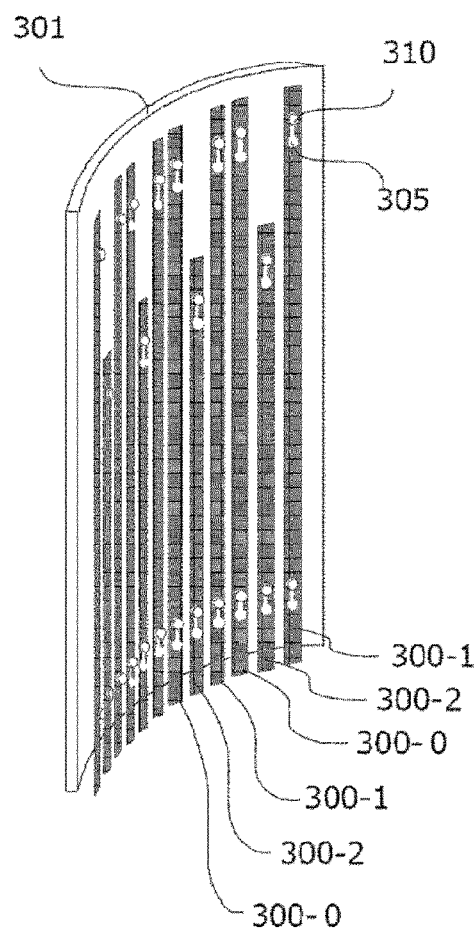
FIGS. 3A and 3B are diagrams schematically illustrating an electrode structure according to the embodiments of the present disclosure; more specifically.

As shown in FIG. 2, a plurality of electrodes constituting the electrode structure 300 are provided. Hereinafter, the plurality of electrodes constituting the electrode structure 300 may also be simply referred to as "electrodes 300". The electrodes 300 are fixed and installed on an inner wall of the electrode fixture 301. More specifically, as shown in FIGS. 5A and 5B, a plurality of protrusions (which are hooks) 310 on which the electrodes 300 can be hooked are provided on a surface of the inner wall of the electrode fixture 301. Further, a plurality of openings 305 which are through-holes through which the protrusions 310 can be inserted are provided at the electrodes 300. The electrodes 300 can be fixed to the electrode fixture 301 by hooking the electrodes 300 on the protrusions 310 provided on the surface of the inner wall of the electrode fixture 301 through the openings 305. In FIGS. 3A to 4B, an example of fixing one of the electrodes 300 at two locations (that is, two openings 305 are provided for the one of the electrodes 300, and the one of the electrodes 300 is hooked at and fixed by the two protrusions 310) is shown. In FIG. 2, an example in which nine electrodes 300 are fixed to the electrode fixture 301 (that is, three electrodes 300-1, three electrodes 300-2 and three electrodes 300-0 are fixed to the electrode fixture 301 as shown in FIG. 3A or FIG. 4A) is shown. Further, in FIG. 2, for example, a pair of the configuration in which nine electrodes 300 are fixed to the electrode fixture 301 is provided. That is, two electrode fixtures including the electrode fixture 301 and another electrode fixture 301 are provided, nine electrodes 300 are fixed to the electrode fixture 301, and other nine electrodes 300 are fixed to the above-mentioned another electrode fixture 301.

Each of the electrodes 300 (that is, a plurality of first type electrodes including a first type electrode 300-1, a plurality of second type electrodes including a second type electrode 300-2, a plurality of third type electrodes including a third type electrode 300-3 and a plurality of zeroth type electrodes including a zeroth type electrode 300-0) is made of an oxidation resistant material such as nickel (Ni). Hereinafter, the plurality of first type electrodes including the first type electrode 300-1, the plurality of second type electrodes including the second type electrode 300-2, the plurality of third type electrodes including the third type electrode 300-3 and the plurality of zeroth type electrodes including the zeroth type electrode 300-0 may also be simply referred to as "first type electrodes 300-1", "second type electrodes 300-2", "third type electrodes 300-3" and "zeroth type electrodes 300-0", respectively. Each of the electrodes 300 may be made of a metal material such as SUS, aluminum (Al) and copper (Cu). However, when each of the electrodes 300 is made of the oxidation resistant material such as nickel (Ni), it is possible to suppress a deterioration of an electrical conductivity, and it is also possible to suppress a decrease in an efficiency of generating the plasma. Furthermore, the electrodes 300 can also be made of a nickel alloy material to which aluminum (Al) is added. In such a case, an aluminum oxide film (AlO film) (which is an oxide film with high heat resistance and high corrosion resistance) can be formed on an outermost surface of each of the electrodes 300. The AlO film formed on the outermost surface of each of the electrodes 300 acts as a protective film (which is a block film or a barrier film), and can suppress a progress of the deterioration inside each of the electrodes 300. Thereby, it is possible to further suppress the decrease in the efficiency of generating the plasma due to a decrease in the electrical conductivity of each of the electrodes 300. The electrode fixture 301 is made of an insulating material (insulator), for example, a heat resistant material such as quartz and SiC. It is preferable that the material of the electrode fixture 301 is the same as that of the reaction tube 203.

Figure 3B:
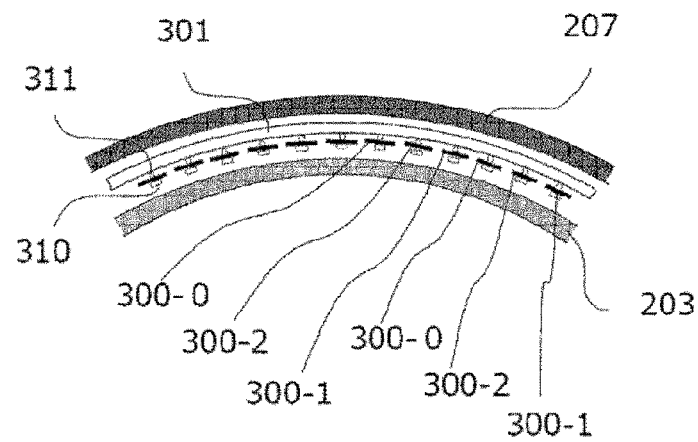
Figure 4A:
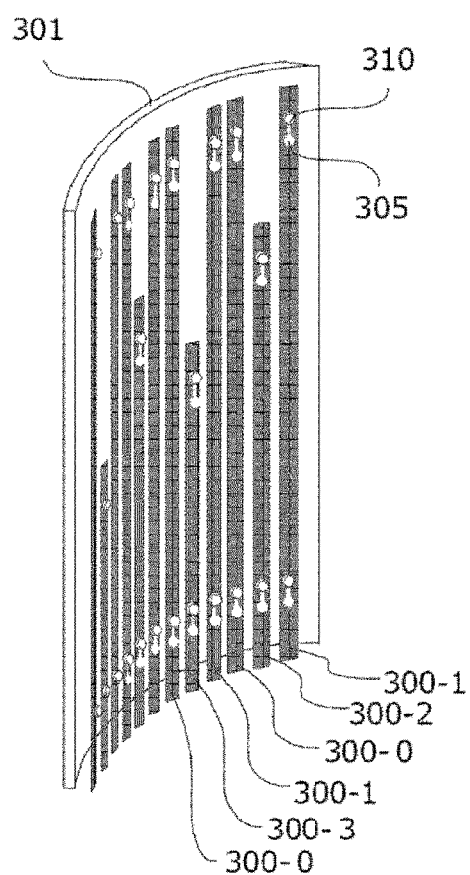
FIGS. 4A and 4B are diagrams schematically illustrating an electrode structure according to a first modified example of the embodiments of the present disclosure; more specifically.
Figure 4B:
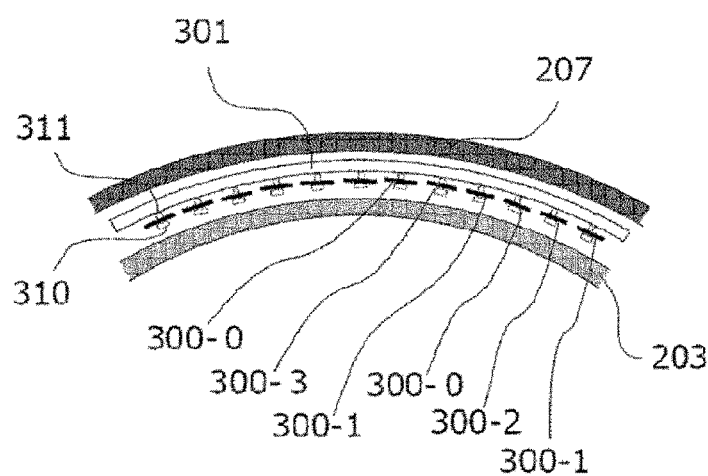
Figure 5A:
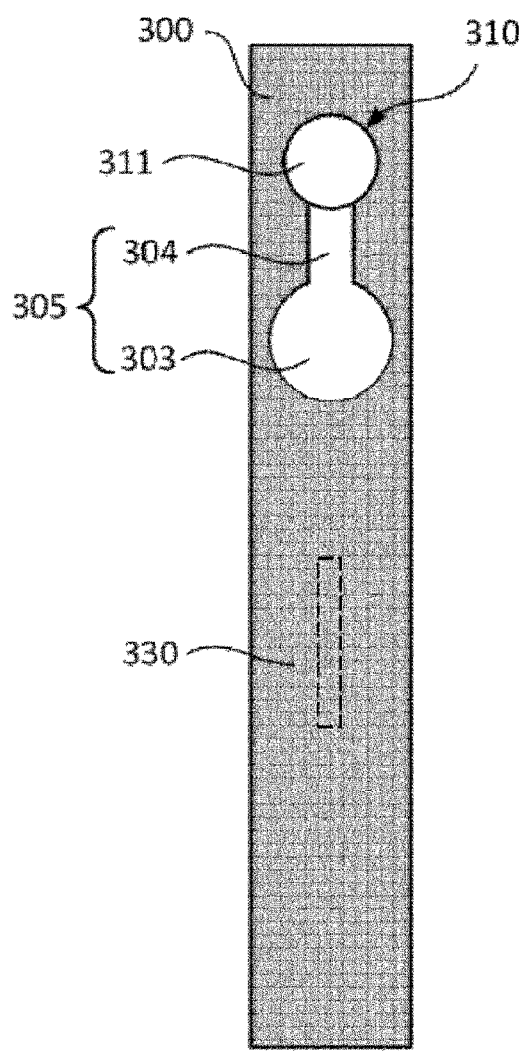
FIGS. 5A and 5B are diagrams schematically illustrating the electrode structure according to the embodiments of the present disclosure; more specifically.
Figure 5B:
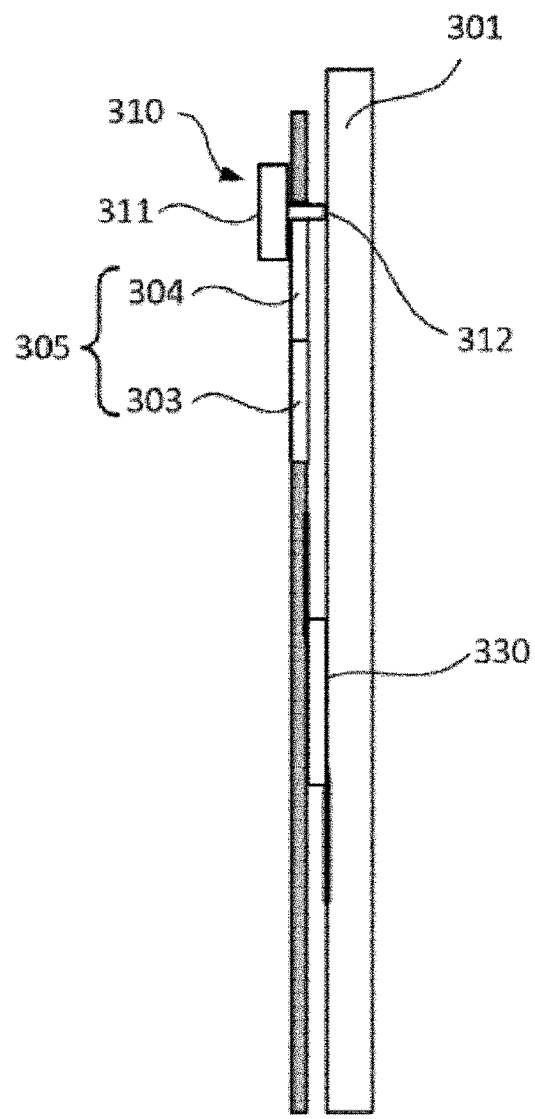

As shown in FIGS. 3A, 3B, 4A and 4B, the electrodes 300 may include the first type electrodes 300-1, the second type electrodes 300-2, the third type electrodes 300-3 and the zeroth type electrodes 300-0. The first type electrodes 300-1, the second type electrodes 300-2 and the third type electrodes 300-3 are connected to a high frequency power supply (also referred to as an "RF power supply") 320 via a matcher (which is a matching structure) 325, and an appropriate electric potential is applied thereto. The zeroth type electrodes 300-0 are grounded, and each of the zeroth type electrodes 300-0 serves as a reference potential (0 V). The first type electrode 300-1, the second type electrode 300-2 and the third type electrode 300-3 may also be collectively or individually referred to as "hot electrode(s)" or "HOT electrode(s)", and the zeroth type electrode 300-0 may also be referred to as a "ground electrode" or a "GND electrode". Each of the first type electrode 300-1, the second type electrode 300-2, the third type electrode 300-3 and the zeroth type electrode 300-0 is configured as a plate-shaped structure when viewed from front. In FIG. 2, an example in which the first type electrodes 300-1, the second-type electrodes 300-2, and the zeroth type electrodes 300-0 are provided is shown. In FIGS. 3A and 3B, an example in which four first type electrodes 300-1, four second type electrodes 300-2 and four zeroth type electrodes 300-0 are provided is shown. In FIGS. 4A and 4B, an example in which the third type electrodes 300-3 are further provided, that is, an example in which four first type electrodes 300-1, two second type electrodes 300-2, two third type electrodes 300-3 and four zeroth type electrodes 300-0 are provided is shown. By applying an RF power between the first type electrodes 300-1 and the zeroth type electrodes 300-0 from the RF power supply 320 via the matcher 325, the plasma is generated in a region between the first type electrodes 300-1 and the zeroth type electrodes 300-0. Similarly, by applying the RF power between the second type electrodes 300-2 and the zeroth type electrodes 300-0 from the RF power supply 320 via the matcher 325, the plasma is generated in a region between the second type electrodes 300-2 and the zeroth type electrodes 300-0. Further, by applying the RF power between third type electrodes 300-3 and the zeroth type electrodes 300-0 from the RF power supply 320 via the matcher 325, the plasma is generated in a region between the third type electrodes 300-3 and the zeroth type electrodes 300-0. The regions described above may also be collectively or individually referred to as a "plasma generation region". In addition, as shown in FIG. 1, the electrodes 300 are arranged in a direction perpendicular to the process vessel (that is, the vertical direction or a direction in which the wafers 200 are stacked). Further, as shown in FIGS. 2 through 4B, the electrodes 300 are arranged in an arc shape at an equal interval when viewed from above. That is, the electrodes 300 (the first type electrodes 300-1, the second type electrodes 300-2, the third type electrodes 300-3 and the zeroth type electrodes 300-0) are arranged such that a distance (gap) between two adjacent electrodes among the electrodes 300 is the same. Further, the electrodes 300 are arranged in a substantially arc shape between the reaction tube 203 and the heater 207 along the outer wall of the reaction tube 203 when viewed from above. That is, the electrodes 300 are arranged on and fixed to the surface of the inner wall of the electrode fixture 301 (which is formed in an arc shape with a central angle of 30 degrees or more and 240 degrees or less, for example). In addition, as described above, the electrodes 300 are provided parallel to the nozzles 249a and 249b.

In the present embodiments, the electrode fixture 301 and the electrodes 300 (the first type electrodes 300-1, the second type electrodes 300-2, the third type electrodes 300-3 and the zeroth type electrodes 300-0) may also be collectively referred to as an "electrode configuration". The electrode configuration is preferably arranged at a location that can avoid contact with the nozzles 249a and 249b and the exhaust pipe 231, as shown in FIG. 2. FIG. 2 shows an example in which two electrode configurations are arranged to face each other via centers of the wafers 200 (that is, a center of the reaction tube 203) interposed therebetween while avoiding contact with the nozzles 249a and 249b and the exhaust pipe 231. In the example shown in FIG. 2, the two electrode configurations are arranged line-symmetrically, when viewed from above, with respect to a straight line L serving as an axis of symmetry (that is, the two electrode configurations are arranged symmetrically with each other). By arranging the electrode configurations as described above, it is possible to arrange the nozzles 249a and 249b, a temperature sensor 263 described later and the exhaust pipe 231 outside the plasma generation region in the process chamber 201. Thereby, it is possible to suppress a plasma damage to components (that is, the nozzles 249a and 249b, the temperature sensor 263 and the exhaust pipe 231), a wear and tear of the components and a generation of particles from the components. In the present specification, unless they need to be distinguished separately, the electrode configuration will be described as the electrodes 300.

For example, a plasma (active species) 302 is generated in the reaction tube 203 by inputting a high frequency of 25 MHz or more and 35 MHz or less (more specifically, a frequency of 27.12 MHz) to the electrodes 300 from the high frequency power supply 320 via the matcher 325. By using the plasma 302 generated in such a manner described above, it is possible to supply the plasma 302 for a substrate processing described later to the surfaces of the wafers 200 from the peripheries of the wafers 200. The power is supplied through lower sides (lower ends) of the electrodes 300.

The plasma generator (which is a plasma activator or a plasma exciter) capable of activating (or exciting) the gas into the plasma state is constituted mainly by the electrodes 300 (that is, the first type electrodes 300-1, the second type electrodes 300-2, the third type electrodes 300-3 and the zeroth type electrodes 300-0). The plasma generator may further include the electrode fixture 301, the matcher 325 and the RF power supply 320.

In addition, as described above, the openings 305 are provided at the electrodes 300. As shown in FIGS. 5A and 5B, each of the openings 305 is constituted by: a circular cutout 303 through which a protrusion head 311 (described later) passes; and a slide cutout 304 through a protrusion shaft 312 slides.

Preferably, a thickness of each of the electrodes 300 is set to 0.1 mm or more and 1 mm or less and a width of each of the electrodes 300 is set to 5 mm or more and 30 mm or less such that a strength of each of the electrodes 300 is sufficient and an efficiency of heating the wafers 200 by a heat source such as the heater 207 is not significantly lowered. Further, it is preferable that each of the electrodes 300 is of a bending structure serving as a deformation suppressing structure (which prevents a deformation due to the heating by the heater 207). In such a case, since the electrodes 300 are arranged between the reaction tube 203 made of quartz and the heater 207, it is preferable that a bending angle of the bending structure is set to 90° to 175° by considering space restrictions. A cover film may be formed on surfaces of the electrodes 300 by a thermal oxidation, and a thermal stress may cause the cover film to peel off and to generate the particles. Therefore, it is preferable not to bend the bending structure too much.

The plasma of a CCP mode is generated by using the vertical type substrate processing apparatus in which a frequency of the high frequency power supply 320 is set to 27.12 MHz, a length of each of the electrodes 300 is set to 1 m, and a thickness of each of the electrodes 300 is set to 1 mm.

When a loading range of the wafers 200 in the boat 217 is configured to be 8% or more of an output wavelength of the high frequency power supply 320, a density distribution of the plasma 302 is biased due to an influence of a biased voltage distribution included in a standing wave (which follows a cosine curve) formed by superimposing a traveling wave and a reflected wave in the vertical direction of the electrodes 300. Therefore, a non-uniformity of the film between the wafers 200 appears in a thickness and a quality that correlate with the density distribution of the plasma 302.

In order to address such a problem, based on the fact that a reflection coefficient changes by adjusting a length of a front end (tip) of each of the electrodes 300, there is suggested a method of shifting the voltage distribution of the standing wave downward in a wafer region by changing a phase difference between the traveling wave and the reflected wave. By using the method described above, it is possible to alleviate the bias of the voltage distribution. Thereby, it is possible to secure the density distribution of the plasma 302 with an improved uniformity, and it is also possible to improve the uniformity of the film between the wafers 200 in the thickness or the quality.

For example, as shown in FIGS. 3A and 3B, on the outer wall of the reaction tube 203 of a tubular shape, four first type electrodes 300-1 with a width of 12.5 mm and a height of 1,650 mm, four second type electrodes 300-2 with a width of 12.5 mm and a height of 1,200 mm and four zeroth type electrodes 300-0 with a width of 12.5 mm and a height of 1,650 mm are provided such that a first one of the first type electrodes 300-1, a first one of the second type electrodes 300-2, a first one of the zeroth type electrodes 300-0, a second one of the first type electrodes 300-1, a second one of the second type electrodes 300-2, a second one of the zeroth type electrodes 300-0 and so on are arranged sequentially in this order. Further, gaps (intervals) between two adjacent electrodes (that is, a gap between the first one of the first type electrodes 300-1 and the first one of the second type electrodes 300-2, a gap between the first one of the second type electrodes 300-2 and the first one of the zeroth type electrodes 300-0, a gap between the first one of the zeroth type electrodes 300-0 and the second one of the first type electrodes 300-1 and so on) are equally set to 7.5 mm.

For example, as shown in FIGS. 4A and 4B, on the outer wall of the reaction tube 203 of a tubular shape, four first type electrodes 300-1 with a width of 12.5 mm and a height of 1,650 mm, two second type electrodes 300-2 with a width of 12.5 mm and a height of 1,350 mm, two third type electrodes 300-3 with a width of 12.5 mm and a height of 1,050 mm and four zeroth type electrodes 300-0 with a width of 12.5 mm and a height of 1,650 mm are provided such that a first one of the first type electrodes 300-1, a first one of the second type electrodes 300-2, a first one of the zeroth type electrodes 300-0, a second one of the first type electrodes 300-1, a first one of the third type electrodes 300-3, a second one of the zeroth type electrodes 300-0, a third one of the first type electrodes 300-1, a second one of the second type electrodes 300-2, a third one of the zeroth type electrodes 300-0 and so on are arranged sequentially in this order. Further, gaps (intervals) between two adjacent electrodes (that is, a gap between the first one of the first type electrodes 300-1 and the first one of the second type electrodes 300-2, a gap between the first one of the second type electrodes 300-2 and the first one of the zeroth type electrodes 300-0, a gap between the first one of the zeroth type electrodes 300-0 and the second one of the first type electrodes 300-1, a gap between the second one of the first type electrodes 300-1 and the first one the third type electrodes 300-3, and a gap between the first one the third type electrodes 300-3 and the second one of the zeroth type electrodes 300-0 and so on) are equally set to 7.5 mm.

Regarding a front end position (top position) of each of the electrodes 300 in a case shown in FIGS. 3A and 3B and a case shown in FIGS. 4A and 4B, the front end position of the first type electrode 300-1 is the same as or lower than that of the zeroth type electrode 300-0, the front end position of each of the second type electrode 300-2 and the third type electrode 300-3 is lower than both of that of the first type electrode 300-1 and that of the zeroth type electrode 300-0. More preferably, when the loading range of the wafers 200 in the boat 217 is configured to be 12% of the output wavelength of the high frequency power supply 320, the front ends of the second type electrode 300-2 and the third type electrode 300-3 are located at positions lower than a position of an uppermost wafer among the wafers 200 by 0.5% to 6% (0.5% or more and 6% or less) with respect to the output wavelength of the high frequency power supply 320, and the front end of the zeroth type electrode 300-0 is located at a position equal to or higher than the position of the uppermost wafer among the wafers 200. Further, when both the front ends of the second type electrode 300-2 and the third type electrode 300-3 are located at positions equal to the position of the uppermost wafer among the wafers 200 or when the front end of the second type electrode 300-2 or the third type electrode 300-3 is located at a position lower than the position of the uppermost wafer among the wafers 200 by 0.5% with respect to the output wavelength of the high frequency power supply 320, the bias of the voltage distribution of the electrodes 300 becomes conspicuous. Thereby, it is difficult to secure a uniformity of the density distribution of the plasma 302.

In the present embodiments, for example, the first type electrodes 300-1, the second type electrodes 300-2 and the zeroth type electrodes 300-0 shown in FIG. 3A and the first type electrodes 300-1, the second type electrodes 300-2, the third type electrodes 300-3 and the zeroth type electrodes 300-0 shown in FIG. 4A are summarized as follows. It is assumed that each of the electrodes 300 is configured as follows.

In FIG. 3A, three electrodes arranged from the right to the left (that is, the first type electrode 300-1, the second type electrode 300-2 and the zeroth type electrode 300-0) constitute a first electrode group. The first electrode group is repeatedly arranged. In the first electrode group, the first type electrode 300-1, the second type electrode 300-2 and the zeroth type electrode 300-0 serve as a first electrode, a second electrode and a third electrode, respectively.

In FIG. 4A, three electrodes arranged from the right to the left (that is, the first type electrode 300-1, the second type electrode 300-2 and the zeroth type electrode 300-0) constitute the first electrode group, and three electrodes (that is, the first type electrode 300-1, the third type electrode 300-3 and the zeroth type electrode 300-0) further arranged on a left side of the first electrode group constitute a second electrode group. The first electrode group and the second electrode group may be alternately and repeatedly arranged. In the first electrode group, the first type electrode 300-1, the second type electrode 300-2 and the zeroth type electrode 300-0 serve as the first electrode, the second electrode and the third electrode, respectively. Further, in the second electrode group, the first type electrode 300-1, the third type electrode 300-3 and the zeroth type electrode 300-0 serve as a fourth electrode, a fifth electrode and a sixth electrode, respectively.

In the configurations of the first electrode to the sixth electrode described above, preferably, the electrodes are configured as follows.

1) A length of the second electrode is shorter than a length of the first electrode.
2) A length of the fifth electrode is shorter than a length of the fourth electrode.
3) The length of the fifth electrode is shorter than the length of the second electrode.
4) The length of the second electrode is shorter than a length of the third electrode.
5) The length of the fifth electrode is shorter than a length of the sixth electrode.
6) The length of the first electrode and the length of the fourth electrode are the same.
7) The length of the third electrode and the length of the sixth electrode are the same.
8) The length of the first electrode and the length of the third electrode are the same.
9) The length of the fourth and electrode and the length of the sixth electrode are the same.
10) The length of the second electrode and the length of the fourth electrode (which are arranged adjacent to the third electrode) are different.
11) The first electrode, the second electrode and the third electrode are arranged in the order of the first electrode, the second electrode and the third electrode. Further, the fourth electrode, the fifth electrode and the sixth electrode are arranged in the order of the fourth electrode, the fifth electrode and the sixth electrode.
12) The first electrode, the second electrode and the third electrode are arranged at an equal interval (gap). Further, the fourth electrode, the fifth electrode and the sixth electrode are arranged at an equal interval (gap).
13) Each of a center-to-center distance between the first electrode and the second electrode, a center-to-center distance between the second electrode and the third electrode, a center-to-center distance between the fourth electrode and the fifth electrode, and a center-to-center distance between the fifth electrode and the sixth electrode is 13.0 mm or more and 53.5 mm or less.
14) The first electrode, the second electrode, the third electrode, the fourth electrode, the fifth electrode and the sixth electrode are arranged in the direction in which the wafers 200 are stacked and accommodated (that is, a direction perpendicular to the process chamber 201).
15) The front end of the second electrode is located lower than the front end of the first electrode.
16) The front end of the fifth electrode is located lower than the front end of the fourth electrode.
17) The front end of the fifth electrode is located lower than the front end of the second electrode.
18) The front end of the second electrode is located lower than the front end of the third electrode.
19) The front end of the fifth electrode is located lower than the front end of the sixth electrode.
20) The front end of the first electrode and the front end of the fourth electrode are located at the same height.
21) The front end of the third electrode and the front end of the sixth electrode are located at the same height.
22) The front end of the second electrode and the front end of the fifth electrode are located at positions lower than the position of the uppermost wafer among the wafers 200 (which are stacked and accommodated in the wafer arrangement region) by 0.5% to 6% (0.5% or more and 6% or less) with respect to the output wavelength of the high frequency power supply 320 applied thereto.
23) The frequency of the high frequency power applied to the first electrode, the second electrode, the fourth electrode and the fifth electrode is 25 MHz or more and 35 MHz or less.
24) The first electrode group and the second electrode group are provided outside the process chamber 201 in which the wafers 200 are processed, and are configured to generate the plasma within the process chamber 201.
25) The heater (heating structure) 207 capable of heating the wafers 200 is provided, and the first electrode group and the second electrode group are provided between the process chamber 201 and the heater 207.

As described above, when the electrodes 300 is configured appropriately, an electric field generated between the inner wall of the reaction tube 203 and the wafers 200 in the vicinity of the electrodes 300 is uniformly and strongly distributed. Thereby, the plasma 302 whose density is high can be evenly (or uniformly) distributed. In addition, it is possible to simultaneously improve an efficiency, a quality and a uniformity of the substrate processing. Further, when the front end of the second type electrode 300-2 and the front end of the third type electrode 300-3 are located at positions lower than the position of the uppermost wafer among the wafers 200 by 1.5% to 4.5% with respect to the output wavelength of the high frequency power supply 320, it is possible to further improve the efficiency, the quality and the uniformity of the substrate processing.

In the present embodiments, an inner pressure of a furnace (that is, the process furnace 202) when the substrate processing is performed may be preferably controlled within a range of 10 Pa or more and 300 Pa or less. When the inner pressure of the furnace is lower than 10 Pa, a mean free path of gas molecules becomes longer than the Debye length of the plasma, and the plasma directly hitting a wall of the furnace becomes noticeable. As a result, it is difficult to suppress the generation of the particles. Further, when the inner pressure of the furnace is higher than 300 Pa, the efficiency of generating the plasma is saturated so that an amount of the plasma generated does not change even when the reactive gas is supplied. Thereby, the reactive gas may be wasted. In addition, since the mean free path of the gas molecules is shortened, a transport efficiency of the active species of the plasma to the wafers 200 may deteriorate.

<Electrode Fixing Jig>

Subsequently, the electrode fixture 301 serving as an electrode fixing jig capable of fixing the electrodes 300 will be described with reference to FIGS. 3A, 3B, 5A and 5B. As shown in FIGS. 3A, 3B, 5A and 5B, the electrodes 300 are fixed by hooking the openings 305 thereof into the protrusions 310 provided on the surface of the inner wall of the electrode fixture 301 (which is a curved fixing jig) and sliding the electrodes 300 until the electrodes 300 are installed on an outer periphery of the reaction tube 203 so as to be integrated with the electrode fixture 301 as a single body (hook-type electrode structure). As described above, for example, the electrode fixture 301 is made of quartz, and each of the electrodes 300 is made of the nickel alloy.

Preferably, a thickness of the electrode fixture 301 is set to 1 mm or more and 5 mm or less such that a strength of the electrode fixture 301 is sufficient and the efficiency of heating the wafers 200 by the heater 207 is not significantly lowered. When the thickness of the electrode fixture 301 is less than 1 mm, it becomes impossible to obtain a desired strength against the own weight of the electrode fixture 301 and a desired resistance against a temperature change. When the thickness of the electrode fixture 301 is more than 5 mm, the electrode fixture 301 absorbs the heat energy radiated from the heater 207 so that a heat treatment process for the wafers 200 cannot be properly performed.

Further, the electrode fixture 301 is provided with the plurality of protrusions 310 serving as tack-shaped fixing jigs capable of fixing the electrodes 300 on the surface of the inner wall of the electrode fixture 301 facing the reaction tube 203. Each of the protrusions 310 is constituted by the protrusion head 311 and the protrusion shaft 312. A maximum width of the protrusion head 311 is smaller than a diameter of the circular cutout 303 of the openings 305 of the electrodes 300, and a maximum width of the protrusion shaft 312 is smaller than a width of the slide cutout 304. Each of the openings 305 of the electrodes 300 is of a keyhole-like shape, the slide cutout 304 is capable of guiding the protrusion shaft 312 while the electrodes 300 are slid therealong, and the protrusion head 311 is configured so as not to fall out of (or come off) the slide cutout 304. In other words, it can be said that the electrode fixture 301 includes a fixing portion provided with the protrusion head 311 serving as a front end portion capable of preventing the electrodes 300 from slipping out of the protrusion shaft 312 (which is a columnar structure with which the electrodes 300 are engaged). Further, it is apparent that shapes of the openings 305 and the protrusion head 311 described above are not limited to the shapes shown in FIGS. 3A, 3B, 5A and 5B as long as the electrodes 300 are capable of being engaged with the electrode fixture 301. For example, the protrusion head 311 may be of a convex shape such as a hammer shape and a thorn shape.

In order to maintain a constant distance between the electrode fixture 301 (or the reaction tube 203) and each of the electrodes 300, the electrode fixture 301 or the electrodes 300 may be provided with an elastic structure such as a spacer and a spring between them, or the elastic structure may be integrated with the electrode fixture 301 or the electrodes 300 as a single body. According to the present embodiments, a spacer 330 as shown in FIG. 5B is integrated with the electrode fixture 301 as a single body. It is effective to provide a plurality of spacers including the spacer 330 for each of the electrodes 300 in order to maintain the constant distance between the electrode fixture 301 and each of the electrodes 300 by fixing them at the constant distance.

In order to obtain a high substrate processing capability at a substrate temperature of 500° C. or less, it is preferable that the electrode fixture 301 is of a substantially arc shape with a central angle of 30° or more and 240° or less. Further, in order to avoid the generation of the particles, it is preferable that the electrode fixture 301 is arranged to avoid contact with the exhaust pipe 231 serving as the exhaust port and the nozzles 249a and 249b. In other words, the electrode fixture 301 is arranged on the outer periphery of the reaction tube 203 other than locations where the nozzles 249a and 249b serving as a part of the gas supplier and the exhaust pipe 231 serving as a part of an exhauster described later are installed in the reaction tube 203. According to the present embodiments, two electrode fixtures 301 with a central angle of 110° are installed symmetrically.

<Spacer>

Subsequently, the spacer 330 for fixing each of the electrodes 300 to the electrode fixture 301 serving as the electrode fixing jig (or the outer wall of the reaction tube 203) with the constant distance therebetween will be described with reference to FIGS. 5A and 5B. For example, the spacer 330 is made of quartz material of a cylindrical shape, and is integrated with the electrode fixture 301 as a single body. By bringing the spacer 330 into contact with the electrodes 300, the electrodes 300 are fixed to the electrode fixture 301. As long as the electrodes 300 can be fixed to the electrode fixture 301 (or the reaction tube 203) with the constant distance therebetween, the spacer 330 can be integrated with either the electrodes 300 or the electrode fixture 301 as a single body regardless of its shape. For example, the spacer 330 may be made of quartz material of a semi-cylindrical shape and integrated with the electrode fixture 301 as a single body to fix the electrodes 300. Alternatively, the spacer 330 may be made of a metal material of a shape such as SUS and integrated with the electrode 300 as a single body to fix the electrodes 300. In each case described above, the protrusions 310 and the spacers 330 are provided, it is possible to easily determine a position of the electrodes 300, and the electrodes 300 can be selectively replaced when the electrodes 300 deteriorates. Therefore, it is possible to reduce a maintenance cost. Further, the spacer 330 may be included in the electrode configuration described above.

<Exhauster>

As shown in FIG. 1, the exhaust pipe 231 through which an inner atmosphere of the process chamber 201 is exhausted is provided at the reaction tube 203. A vacuum pump 246 serving as a vacuum exhaust apparatus is connected to the exhaust pipe 231 through a pressure sensor 245 and an APC (Automatic Pressure Controller) valve 244. The pressure sensor 245 serves as a pressure detector (which is a pressure detection structure) to detect an inner pressure of the process chamber 201, and the APC valve 244 serves as an exhaust valve (which is a pressure regulator). With the vacuum pump 246 in operation, the APC valve 244 may be opened or closed to perform a vacuum exhaust of the process chamber 201 or stop the vacuum exhaust. Further, with the vacuum pump 246 in operation, an opening degree of the APC valve 244 may be adjusted based on pressure information detected by the pressure sensor 245, in order to control (or adjust) the inner pressure of the process chamber 201. The exhauster (which is an exhaust structure or an exhaust system) is constituted mainly by the exhaust pipe 231, the APC valve 244 and the pressure sensor 245. The exhauster may further include the vacuum pump 246. However, the present embodiments are not limited to an example in which the exhaust pipe 231 is provided at the reaction tube 203. For example, similar to the nozzles 249a and 249b, the exhaust pipe 231 may be provided at the manifold 209 instead of the reaction tube 203.

<Peripheral Components>

The seal cap 219 serving as a furnace opening lid capable of airtightly sealing (or closing) a lower end opening of the manifold 209 is provided under the manifold 209. The seal cap 219 is in contact with the lower end of the manifold 209 from thereunder. For example, the seal cap 219 is made of a metal material such as SUS, and is of a disk shape. An O-ring 220b serving as a seal is provided on an upper surface of the seal cap 219 so as to be in contact with the lower end of the manifold 209.

A rotator 267 capable of rotating the boat 217 is provided at the seal cap 219 in a manner opposite to the process chamber 201. A rotating shaft 255 of the rotator 267 is connected to the boat 217 through the seal cap 219. As the rotator 267 rotates the boat 217, the wafers 200 are rotated. The seal cap 219 may be elevated or lowered in the vertical direction by a boat elevator 115 serving as an elevating structure vertically provided outside the reaction tube 203. When the seal cap 219 is elevated or lowered in the vertical direction by the boat elevator 115, the boat 217 may be transferred (loaded) into the process chamber 201 or transferred (unloaded) out of the process chamber 201.

The boat elevator 115 serves as a transfer device (which is a transfer structure or a transfer system) that loads the boat 217 and the wafers 200 accommodated in the boat 217 into the process chamber 201 or unloads the boat 217 and the wafers 200 accommodated in the boat 217 out of the process chamber 201. Further, a shutter 219s serving as a furnace opening lid capable of airtightly sealing (or closing) the lower end opening of the manifold 209 is provided under the manifold 209. The shutter 219s is configured to close the lower end opening of the manifold 209 when the seal cap 219 is lowered by the boat elevator 115. For example, the shutter 219s is made of a metal material such as SUS, and is of a disk shape. An O-ring 220c serving as a seal is provided on an upper surface of the shutter 219s so as to be in contact with the lower end of the manifold 209. An opening and closing operation of the shutter 219s such as an elevation operation and a rotation operation is controlled by a shutter opener/closer (which is a shutter opening/closing structure) 115s.

The temperature sensor 263 serving as a temperature detector is installed in the reaction tube 203. A state of electric conduction to the heater 207 is adjusted based on temperature information detected by the temperature sensor 263 such that a desired temperature distribution of an inner temperature of the process chamber 201 can be obtained. Similar to the nozzles 249a and 249b, the temperature sensor 263 is provided along the inner wall of the reaction tube 203.

<Controller>

Figure 6:
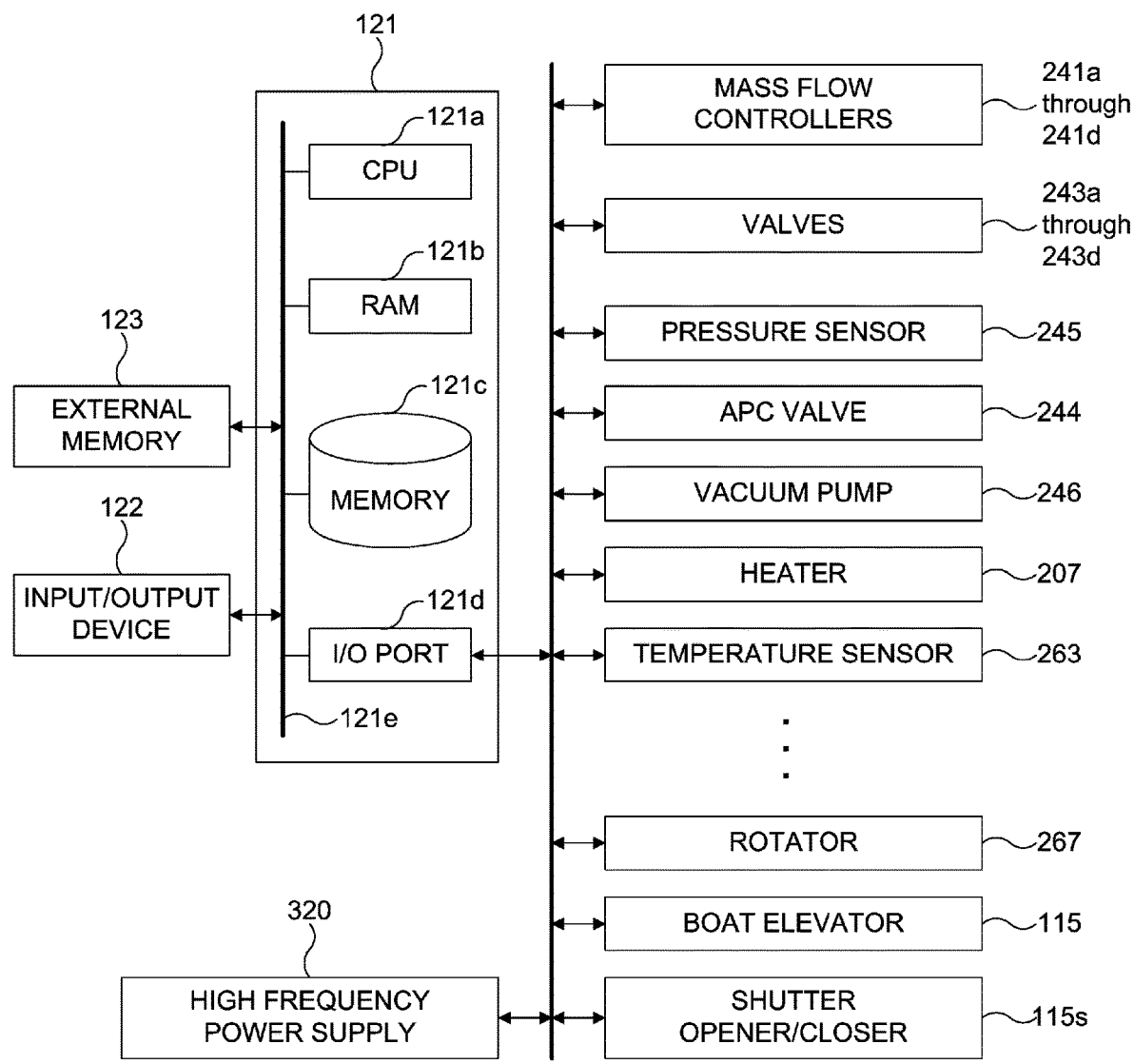
FIG. 6 is a block diagram schematically illustrating an exemplary configuration of a controller and related components of the substrate processing apparatus shown in FIG. 1.

A controller 121 will be described with reference to FIG. 6. As shown in FIG. 6, the controller 121 serving as a control device (or a control structure) is constituted by a computer including a CPU (Central Processing Unit) 121a, a RAM (Random Access Memory) 121b, a memory 121c and an I/O port 121d. The RAM 121b, the memory 121c and the I/O port 121d may exchange data with the CPU 121a through an internal bus 121e. For example, an input/output device 122 constituted by a component such as a touch panel is connected to the controller 121.

For example, the memory 121c is configured by a component such as a flash memory, a hard disk drive (HDD) and a solid state drive (SSD). For example, a control program configured to control an operation of the substrate processing apparatus or a process recipe containing information on sequences and conditions of a film-forming process (that is, the substrate processing) described later is readably stored in the memory 121c. The process recipe is obtained by combining steps of various processes such as the film-forming process (described later) such that the controller 121 can execute the steps to acquire a predetermined result, and functions as a program. Hereafter, the process recipe and the control program may be collectively or individually referred to as a "program". Further, the process recipe may also be simply referred to as a "recipe". Thus, in the present specification, the term "program" may refer to the recipe alone, may refer to the control program alone, or may refer to both of the recipe and the control program. The RAM 121b functions as a memory area (work area) where a program or data read by the CPU 121a is temporarily stored.

The I/O port 121d is connected to the above-described components such as the MFCs 241a through 241d, the valves 243a through 243d, the pressure sensor 245, the APC valve 244, the vacuum pump 246, the temperature sensor 263, the heater 207, the rotator 267, the boat elevator 115, the shutter opener/closer 115s and the high frequency power supply 320.

The CPU 121a is configured to read the control program from the memory 121c and execute the read control program. In addition, the CPU 121a is configured to read the recipe from the memory 121c in accordance with an operation command inputted from the input/output device 122. In accordance with the contents of the read recipe, the CPU 121a may be configured to control various operations such as a control operation of the rotator 267, flow rate adjusting operations for various gases by the MFCs 241a through 241d, opening and closing operations of the valves 243a through 243d, an opening and closing operation of the APC valve 244, a pressure adjusting operation by the APC valve 244 based on the pressure sensor 245, a start and stop of the vacuum pump 246, a temperature adjusting operation by the heater 207 based on the temperature sensor 263, operations of adjusting a forward rotation and a reverse rotation, a rotation angle and a rotation speed of the boat 217 by the rotator 267, an elevating and lowering operation of the boat 217 by the boat elevator 115, an opening and closing operation of the shutter 219s by the shutter opener/closer 115s and a power supply operation of the high frequency power supply 320.

The controller 121 may be embodied by installing the above-described program stored in an external memory 123 into the computer. For example, the external memory 123 may include a magnetic disk such as a hard disk, an optical disk such as a CD, a magneto-optical disk such as an MO and a semiconductor memory such as a USB memory. The memory 121c or the external memory 123 may be embodied by a non-transitory computer readable recording medium. Hereafter, the memory 121c and the external memory 123 may be collectively or individually referred to as a "recording medium". Thus, in the present specification, the term "recording medium" may refer to the memory 121c alone, may refer to the external memory 123 alone, or may refer to both of the memory 121c and the external memory 123. Instead of the external memory 123, a communication structure such as the Internet and a dedicated line may be used for providing the program to the computer.

(2) Substrate Processing

Hereinafter, the substrate processing (that is, the film-forming process) of forming a film on the wafers 200 by using the substrate processing apparatus described above, which is a part of a manufacturing process of a semiconductor device, will be described with reference to FIG. 7. In the following descriptions, operations of components constituting the substrate processing apparatus are controlled by the controller 121.

In the present specification, a process flow of the film-forming process shown in FIG. 7 may be illustrated as follows. Film-forming processes of a modified example and other embodiments, which will be described later, will be also represented in the same manner.

(Source gas→Reactive gas)×n

In the present specification, the term "wafer" may refer to "a wafer itself" or may refer to "a wafer and a stacked structure (aggregated structure) of a predetermined layer (or layers) or a film (or films) formed on a surface of the wafer". In the present specification, the term "a surface of a wafer" may refer to "a surface of a wafer itself" or may refer to "a surface of a predetermined layer (or a predetermined film) formed on a wafer". In the present specification, the terms "substrate" and "wafer" may be used as substantially the same meaning.

<Substrate Charging and Boat Loading Step: S16>

After the wafers 200 are charged (or transferred) into the boat 217 (substrate charging step), the shutter 219s is moved by the shutter opener/closer 115s to open the lower end opening of the manifold 209 (shutter opening step). Then, as shown in FIG. 1, the boat 217 charged with the wafers 200 is elevated by the boat elevator 115 and loaded (or transferred) into the process chamber 201 (boat loading step). With the boat 217 loaded, the seal cap 219 seals the lower end of the manifold 209 via the O-ring 220b.

<Pressure and Temperature Adjusting Step: S2>

In the present step, the vacuum pump 246 vacuum-exhausts (decompresses and exhausts) the process chamber 201 such that the inner pressure of the process chamber 201 reaches and is maintained at a desired pressure (vacuum degree). When vacuum-exhausting the process chamber 201, the inner pressure of the process chamber 201 is measured by the pressure sensor 245, and the APC valve 244 is feedback-controlled based on the pressure information measured by the pressure sensor 245 (pressure adjusting step). The vacuum pump 246 continuously vacuum-exhausts the process chamber 201 until at least a film-forming step described later is completed.

In addition, the heater 207 heats the process chamber 201 such that the inner temperature of the process chamber 201 reaches and is maintained at a desired temperature. When heating the process chamber 201, the state of electric conduction to the heater 207 is feedback-controlled based on the temperature information detected by the temperature sensor 263 such that the desired temperature distribution of the inner temperature of the process chamber 201 is obtained (temperature adjusting step). The heater 207 continuously heats the process chamber 201 until at least the film-forming step described later is completed. However, when the film-forming step is performed at a temperature equal to or lower than the room temperature, the heating of the process chamber 201 by the heater 207 may be omitted. Further, when the substrate processing including the film-forming step is performed only at the temperature equal to or lower than the room temperature, the heater 207 may be omitted and the substrate processing apparatus may be implemented without the heater 207. In such a case, it is possible to simplify the configuration of the substrate processing apparatus.

Then, the rotator 267 rotates the boat 217 and the wafers 200 accommodated in the boat 217. The rotator 267 continuously rotates the boat 217 and the wafers 200 accommodated in the boat 217 until at least the film-forming step described later is completed.

<Film-Forming Step: S3, S4, S5 and S6>

Thereafter, the film-forming step is performed by performing a cycle including a source gas supply step S3, a purge gas supply step S4, a reactive gas supply step S5 and a purge gas supply step S6.

<Source Gas Supply Step S3 and Purge Gas Supply Step S4>

In the source gas supply step S3, the source gas is supplied onto the wafers 200 in the process chamber 201.

The valve 243a is opened to supply the source gas into the gas supply pipe 232a. After a flow rate of the source gas is adjusted by the MFC 241a, the source gas whose flow rate is adjusted is supplied into the process chamber 201 through the nozzle 249a and the gas supply holes 250a, and is exhausted through the exhaust pipe 231. Thereby, the source gas is supplied onto the wafers 200. Simultaneously, the valve 243c may be opened to supply the inert gas into the gas supply pipe 232c. After a flow rate of the inert gas is adjusted by the MFC 241c, the inert gas whose flow rate is adjusted is supplied together with the source gas into the process chamber 201, and is exhausted through the exhaust pipe 231.

In order to prevent the source gas from entering the nozzle 249b, the valve 243d may be opened to supply the inert gas into the gas supply pipe 232d. The inert gas is supplied into the process chamber 201 through the gas supply pipe 232d and the nozzle 249b, and is exhausted through the exhaust pipe 231.

For example, process conditions of the present step are as follows:

A process temperature: from the room temperature (25° C.) to 550° C., preferably from 400° C. to 500° C.;
A process pressure: from 1 Pa to 4,000 Pa, preferably from 100 Pa to 1,000 Pa;
A supply flow rate of the source gas: from 0.1 slm to 3 slm;
A supply time (time duration) of supplying the source gas: from 1 second to 100 seconds, preferably from 1 second to 50 seconds; and
A supply flow rate of the inert gas (for each gas supply pipe): from 0 slm to 10 slm.

Further, in the present specification, a notation of a numerical range such as "from 25° C. to 550° C." means that a lower limit and an upper limit are included in the numerical range. Therefore, for example, a numerical range "from 25° C. to 550° C." means a range equal to or higher than 25° C. and equal to or lower than 550° C. The same also applies to other numerical ranges described herein. For example, in the present specification, the process temperature refers to a temperature of the wafer 200 or the inner temperature of the process chamber 201, and the process pressure refers to the inner pressure of the process chamber 201. Further, when the supply flow rate of the gas is 0 slm, it means a case where the gas is not supplied. The same also applies to the following description.

By supplying the source gas onto the wafer 200 under the above-described process conditions, a first layer is formed on the wafer 200 (that is, on a base film formed on the surface of the wafer 200). For example, when a silicon (Si)-containing gas described later is used as the source gas, a silicon-containing layer is formed on the wafer 200 as the first layer.

After the first layer is formed in the step S3, the valve 243a is closed to stop a supply of the source gas into the process chamber 201. With the APC valve 244 open, the vacuum pump 246 vacuum-exhausts the inner atmosphere of the process chamber 201 to remove a residual gas remaining in the process chamber 201 such as the source gas which did not react or which contributed to a formation of the first layer and reaction by-products from the process chamber 201 (step S4). By opening the valves 243c and 243d, the inert gas is supplied into the process chamber 201. The inert gas serves as a purge gas.

For example, an aminosilane-based gas such as tetrakis (dimethylamino) silane (Si[N(CH3)2]4, abbreviated as 4DMAS) gas, tris (dimethylamino) silane (Si[N(CH3)2]3H, abbreviated as 3DMAS) gas, bis (dimethylamino) silane (Si[N(CH3)2]2H2, abbreviated as BDMAS) gas, bis (diethylamino) silane (Si[N(C2H5)2]2H2, abbreviated as BDEAS) gas, bis (tertiarybutylamino) silane gas (SiH2[NH (C4H9)]2, abbreviated as BTBAS) and (diisopropylamino) silane (SiH3[N(C3H7)2], abbreviated as DIPAS) gas may be used as the source gas. For example, one or more of the gases described above may be used as the source gas.

For example, a chlorosilane-based gas such as monochlorosilane (SiH3Cl, abbreviated as MCS) gas, dichlorosilane (SiH2Cl2, abbreviated to DCS) gas, trichlorosilane (SiHCl3, abbreviated as TCS) gas, tetrachlorosilane (SiCl4, abbreviated as STC) gas, hexachlorodisilane (Si2Cl6, abbreviated as HCDS) gas and octachlorotrisilane (Si3Cl8, abbreviated as OCTS) gas may be used as the source gas. Further, for example, a fluorosilane-based gas such as tetrafluorosilane (SiF4) gas and difluorosilane (SiH2F2) gas, a bromosilane-based gas such as tetrabromosilane (SiBr4) gas and dibromosilane (SiH2Br2) gas, or an iodine silane-based gas such as tetraiodide silane (SiI4) gas and diiodosilane (SiH2I2) gas may be used as the source gas. That is, a halosilane-based gas may be used as the source gas. For example, one or more of the gases described above may be used as the source gas.

For example, a silicon hydride gas such as monosilane (SiH4, abbreviated as MS) gas, disilane (Si2H6, abbreviated as DS) gas and trisilane (Si3H8, abbreviated as TS) gas may be used as the source gas. For example, one or more of the gases described above may be used as the source gas.

For example, a nitrogen (N2) gas or a rare gas such as argon (Ar) gas, helium (He) gas, neon (Ne) gas and xenon (Xe) gas may be used as the inert gas. The same also applies to each step described later.

<Reactive Gas Supply Step S5 and Purge Gas Supply Step S6>

After the first layer is formed, the reactive gas excited by the plasma is supplied onto the wafers 200 in the process chamber 201 (step S5).

In the present step, the opening and the closing of the valves 243b, 243c and 243d can be controlled in the same manners as those of the valves 243a, 243c and 243d in the source gas supply step S3. After a flow rate of the reactive gas is adjusted by the MFC 241b, the reactive gas whose flow rate is adjusted is supplied into the process chamber 201 through the nozzle 249b and the gas supply holes 250b. When supplying the reactive gas, the high frequency power (RF power) (in the present embodiments, the frequency of the high frequency power is set to 27.12 MHz) is supplied (or applied) to the electrodes 300 from the high frequency power supply 320. The reactive gas supplied into the process chamber 201 is excited into the plasma state in the process chamber 201, is supplied onto the wafers 200 as active species, and is exhausted through the exhaust pipe 231.

For example, process conditions of the present step are as follows:

A process temperature: from the room temperature (25° C.) to 550° C., preferably from 400° C. to 500° C.;

A process pressure: from 1 Pa to 300 Pa, preferably from 10 Pa to 100 Pa;

A supply flow rate of the reactive gas: from 0.1 slm to 10 slm;

A supply time (time duration) of supplying the reactive gas: from 1 second to 100 seconds, preferably from 1 second to 50 seconds;

A supply flow rate of the inert gas (for each gas supply pipe): from 0 slm to 10 slm;

The RF power: from 50 W to 1,000 W; and

The frequency of the RF power: 27.12 MHz.

By supplying the reactive gas (which is excited into the plasma state) onto the wafer 200 under the above-described process conditions, the first layer formed on the surface of the wafer 200 is modified by the action between ions generated in the plasma and the active species which is electrically neutral. Thereby, the first layer is modified into a second layer.

For example, when an oxidizing gas (oxidizing agent) such as an oxygen-containing gas is used as the reactive gas, by exciting the oxygen-containing gas into the plasma state, an oxygen-containing active species is generated. Then, the oxygen-containing active species is supplied onto the wafer 200. In such a case, the first layer formed on the surface of the wafer 200 is oxidized by the action of the oxygen-containing active species as an oxidation process (modification process). In such a case, for example, when the first layer is the silicon-containing layer, the silicon-containing layer serving as the first layer is modified into a silicon oxide layer (also simply referred to as a "SiO layer") serving as the second layer.

For example, when a nitriding gas (nitriding agent) such as a gas containing nitrogen (N) and hydrogen (H) is used as the reactive gas, by exciting the gas containing nitrogen and hydrogen into the plasma state, an active species containing nitrogen and hydrogen is generated. Then, the active species containing nitrogen and hydrogen is supplied onto the wafer 200. In such a case, the first layer formed on the surface of the wafer 200 is nitrided by the action of the active species containing nitrogen and hydrogen as a nitridation process (modification process). In such a case, for example, when the first layer is the silicon-containing layer, the silicon-containing layer serving as the first layer is modified into a silicon nitride layer (also simply referred to as a "SiN layer") serving as the second layer.

After the first layer is modified into the second layer, the valve 243b is closed to stop a supply of the reactive gas into the process chamber 201. Further, the RF power supplied to the electrodes 300 is also stopped. In the purge gas supply step S6, a residual gas remaining in the process chamber 201 such as the reactive gas and reaction by-products in the process chamber 201 is removed from the process chamber 201 according to the same sequence and conditions as those of the purge gas supply step S4.

For example, as described above, the oxygen-containing gas or the gas containing nitrogen (N) and hydrogen (H) may be used as the reactive gas. For example, a gas such as oxygen (O2) gas, nitrous oxide (N2O) gas, nitrogen monoxide (NO) gas, nitrogen dioxide (NO2) gas, ozone (O3) gas, hydrogen peroxide (H2O2) gas, water vapor (H2O), ammonium hydroxide (NH4(OH)) gas, carbon monoxide (CO) gas and carbon dioxide (CO2) gas may be used as the oxygen-containing gas. For example, a hydrogen nitride gas such as ammonia (NH3) gas, diazene (N2H2) gas, hydrazine (N2H4) gas and N3H8 gas may be used as the gas containing nitrogen and hydrogen. For example, one or more of the gases described above may be used as the reactive gas.

For example, various gases exemplified in the step S4 may be used as the inert gas.

<Performing Predetermined Number of Times: S7>

By performing the cycle wherein the steps S3, S4, S5 and S6 described above are performed non-simultaneously in this order a predetermined number of times (n times, wherein n is an integer equal to or greater than 1), a film of a predetermined composition and a predetermined thickness is formed on the wafer 200. It is preferable that the cycle is repeatedly performed a plurality of times. That is, it is preferable that the cycle is repeatedly performed a plurality of times until a thickness of a stacked layer constituted by the first layer and the second layer reaches a desired thickness while a thickness of the first layer formed per each cycle is smaller than the desired thickness. For example, when forming the silicon-containing layer as the first layer and the SiO layer as the second layer, a silicon oxide film (also simply referred to as a "SiO film") is formed as the film. Further, for example, when forming the silicon-containing layer as the first layer and the SiN layer as the second layer, a silicon nitride film (also simply referred to as a "SiN film") is formed as the film.

<Returning to Atmospheric Pressure Step: S8>

After the film-forming step described above is completed, the inert gas is supplied into the process chamber 201 through each of the gas supply pipes 232c and 232d, and then is exhausted through the exhaust pipe 231. The process chamber 201 is thereby purged with the inert gas such that the residual reactive gas or the reaction by-products remaining in the process chamber 201 are removed from the process chamber 201 (purging by the inert gas). Thereafter, the inner atmosphere of the process chamber 201 is replaced with the inert gas (substitution by the inert gas), and the inner pressure of the process chamber 201 is returned to the atmospheric pressure (returning to atmospheric pressure step S8).

<Boat Unloading and Substrate Discharging Step: S9>

Then, the seal cap 219 is lowered by the boat elevator 115 and the lower end of the manifold 209 is opened. The boat 217 with processed wafers 200 charged therein is transferred (or unloaded) out of the reaction tube 203 through the lower end of the manifold 209 (boat unloading step). After the boat 217 is unloaded, the shutter 219s is moved. Thereby, the lower end opening of the manifold 209 is sealed by the shutter 219s through the O-ring 220c (shutter closing step). The processed wafers 200 are taken out of the reaction tube 203, and then discharged from the boat 217 (wafer discharging step). Further, an empty boat 217 may be loaded into the process chamber 201 after the wafer discharging step is performed.

In the present embodiments, the inner pressure of the furnace (that is, the process furnace 202) when the substrate processing is performed may be preferably controlled within the range of 10 Pa or more and 300 Pa or less. When the inner pressure of the furnace is lower than 10 Pa, the mean free path of the gas molecules becomes longer than the Debye length of the plasma, and the plasma directly hitting the wall of the furnace becomes noticeable. As a result, it is difficult to suppress the generation of the particles. Further, when the inner pressure of the furnace is higher than 300 Pa, the efficiency of generating the plasma is saturated so that the amount of the plasma generated does not change even when the reactive gas is supplied. Thereby, the reactive gas may be wasted. In addition, since the mean free path of the gas molecules is shortened, the transport efficiency of the active species of the plasma to the wafers 200 may deteriorate.

(3) Effects According to Present Embodiments

By configuring the loading range of the wafers 200 in the boat 217 to be 12% of the output wavelength of the high frequency power supply 320; locating the front ends of the second type electrode 300-2 and the third type electrode 300-3 at the positions lower than the position of the uppermost wafer among the wafers 200 by 0.5% to 6% with respect to the output wavelength of the high frequency power supply 320; and locating the front end of the zeroth type electrode 300-0 at the position equal to or higher than the position of the uppermost wafer among the wafers 200, the electric field generated between the inner wall of the reaction tube 203 and the wafers 200 in the vicinity of the electrodes 300 is uniformly and strongly distributed in the vertical direction (that is, the stacking direction of the wafers 200). Thereby, the plasma 302 whose density is high can be evenly (or uniformly) distributed in the vertical direction. In addition, it is possible to simultaneously improve the efficiency, the quality of the substrate processing and a uniformity of the substrate processing between the wafers 200.

Other Embodiments of Present Disclosure

While the technique of the present disclosure is described in detail by way of the embodiments described above, the technique of the present disclosure is not limited thereto. The technique of the present disclosure may be modified in various ways without departing from the scope thereof.

For example, the embodiments described above are described by way of an example in which the reactive gas is supplied after the source gas is supplied. However, the technique of the present disclosure is not limited thereto. The technique of the present disclosure may also be applied when a supply order of the source gas and the reactive gas is changed. That is, the technique of the present disclosure may be applied when the source gas is supplied after the reactive gas is supplied. By changing the supply order of the gases, it is possible to change the quality or the composition of the film formed by performing the substrate processing.

For example, the embodiments described above are described by way of an example in which the silicon oxide film (SiO film) or the silicon nitride film (SiN film) is formed on the wafer 200. However, the technique of the present disclosure is not limited thereto. For example, the technique of the present disclosure may also be preferably applied to form, on the wafer 200, a silicon-based oxide film such as a silicon oxycarbide film (SiOC film), a silicon oxycarbonitride film (SiOCN film) and a silicon oxynitride film (SiON film).

For example, the technique of the present disclosure may also be applied to form, on the wafer 200, various films such as the silicon nitride film (SiN film), the silicon oxynitride film (SiON film), the silicon oxycarbonitride film (SiOCN film), the silicon oxycarbide film (SiOC film), a silicon carbonitride film (SiCN film), a silicon boronitride film (SiBN film), a silicon borocarbonitride film (SiBCN film) and a boron carbonitride film (BCN film). In such cases, instead of the gases described above or in addition to the gases described above, a nitrogen (N)-containing gas such as the NH3 gas, a carbon (C)-containing gas such as propylene (C3H6) gas and a boron (B)-containing gas such as boron trichloride (BCl3) gas may be used to form the various films. In addition, a sequential order of supplying the gases described above may be appropriately changed. When forming the various films, the process conditions of the film-forming process may be substantially the same as those of the film-forming process according to the embodiments described above, and it is possible to obtain substantially the same effects as those of the embodiments described above. In such cases, the oxidizing agent serving as the reactive gas may be the same as that of the embodiments described above.

The technique of the present disclosure may also be preferably applied to form, on the wafer 200, a metal-based oxide film or a metal-based nitride film containing a metal element such as titanium (Ti), zirconium (Zr), hafnium (Hf), tantalum (Ta), niobium (Nb), aluminum (Al), molybdenum (Mo) and tungsten (W). That is, the technique of the present disclosure may also be preferably applied to form, on the wafer 200, a film such as a TiO film, a TiOC film, a TiOCN film, a TiON film, a TiN film, a TiSiN film, a TiBN film, a TiBCN film, a ZrO film, a ZrOC film, a ZrOCN film, a ZrON film, a ZrN film, a ZrSiN film, a ZrBN film, a ZrBCN film, a HfO film, a HfOC film, a HfOCN film, a HfON film, a HfN film, a HfSiN film, a HfBN film, a HfBCN film, a TaO film, a TaOC film, a TaOCN film, a TaON film, a TaN film, a TaSiN film, a TaBN film, a TaBCN film, a NbO film, a NbOC film, a NbOCN film, a NbON film, a NbN film, a NbSiN film, a NbBN film, a NbB CN film, an AlO film, an AlOC film, an AlOCN film, an AlON film, an AlN film, an AlSiN film, an AlBN film, an AlBCN film, a MoO film, a MoOC film, a MoOCN film, a MoON film, a MoN film, a MoSiN film, a MoBN film, a MoBCN film, a WO film, a WOC film, a WOCN film, a WON film, a WN film, a WSiN film, a WBN film and a WBCN film.

For example, various gases such as tetrakis (dimethylamino) titanium (Ti[N(CH3)2]4, abbreviated as TDMAT) gas, tetrakis (ethylmethylamino) hafnium (Hf[N(C2H5)(CH3)]4, abbreviated as TEMAH) gas, tetrakis (ethylmethylamino) zirconium (Zr[N(C2H5)(CH3)]4, abbreviated as TEMAZ) gas, trimethylaluminum (Al(CH3)3, abbreviated as TMA) gas, titanium tetrachloride (TiCl4) gas and hafnium tetrachloride (HfCl4) gas may be used as the source gas to form the metal-based oxide film or the metal-based nitride film described above.

That is, the technique of the present disclosure may also be preferably applied to form a metalloid film containing a metalloid element or a metal-based film containing a metal element. The process sequences and the process conditions of the film-forming process of the metalloid film or the metal-based film may be substantially the same as those of the film-forming process according to the embodiments or the modified example described above. Even when the technique of the present disclosure is applied to the film-forming process of the metalloid film or the metal-based film, it is possible to obtain substantially the same effects as those of the embodiments described above.

It is preferable that recipes used in the film-forming process are prepared individually in accordance with process contents and stored in the memory 121*c* via an electric communication line or the external memory 123. When starting various processes, it is preferable that the CPU 121*a* selects an appropriate recipe among the recipes stored in the memory 121*c* in accordance with the process contents. Thus, various films of different composition ratios, qualities and thicknesses can be formed in a reproducible manner and in a universal manner by using a single substrate processing apparatus. In addition, since a burden on an operating personnel of the substrate processing apparatus can be reduced, various processes can be performed quickly while avoiding a malfunction of the substrate processing apparatus.

The recipe described above is not limited to creating a new recipe. For example, the recipe may be prepared by changing an existing recipe stored in the substrate processing apparatus in advance. When changing the existing recipe to a new recipe, the new recipe may be installed in the substrate processing apparatus via the electric communication line or the recording medium in which the new recipe is stored. Further, the existing recipe already stored in the substrate processing apparatus may be directly changed to the new recipe by operating the input/output device 122 of the substrate processing apparatus.

According to some embodiments of the present disclosure, it is possible to performing the substrate processing more uniformly.

What is claimed is:

1. A substrate processing apparatus comprising:
   a process chamber in which a substrate is processed; and
   a plasma generator comprising an electrode structure capable of generating a plasma, wherein the electrode structure comprises:
      a first electrode group constituted by: a first electrode to which an electric potential is applied; a second electrode to which an electric potential is applied; and at least one third electrode to which a reference potential is applied, wherein the first electrode, the second electrode, and the at least one third electrode are sequentially arranged in aforelisted order, and the first electrode and the second electrode arranged adjacent to each other have different lengths from each other; and
      a second electrode group constituted by: a fourth electrode to which an electric potential is applied; a fifth electrode to which an electric potential is applied; and at least one sixth electrode to which the reference potential is applied, wherein the fourth electrode, the fifth electrode, and the at least one sixth electrode are sequentially arranged in aforelisted order, and the fourth electrode and the fifth electrode arranged adjacent to each other have different lengths from each other.

2. The substrate processing apparatus of claim 1, wherein a length of the second electrode is shorter than that of the first electrode arranged adjacent to the second electrode.

3. The substrate processing apparatus of claim 1, wherein a length of the fifth electrode is shorter than that of the fourth electrode arranged adjacent to the fifth electrode.

4. The substrate processing apparatus of claim 1, wherein a length of the fifth electrode is shorter than that of the second electrode.

5. The substrate processing apparatus of claim 1, wherein a length of the second electrode is shorter than that of the at least one third electrode arranged adjacent to the second electrode.

6. The substrate processing apparatus of claim 1, wherein a length of the fifth electrode is shorter than that of the at least one sixth electrode arranged adjacent to the fifth electrode.

7. The substrate processing apparatus of claim 1, wherein a length of the second electrode different from that of the first electrode is equal to a length of the fifth electrode different from that of the fourth electrode.

8. The substrate processing apparatus of claim 1, wherein a length of the second electrode to which the electric potential is applied is different from that of the fourth electrode to which the electric potential is applied, and the second electrode and the fourth electrode are arranged adjacent to the at least one third electrode to which the reference potential is applied.

9. The substrate processing apparatus of claim 1, wherein each of the first electrode, the second electrode, the at least one third electrode, the fourth electrode, the fifth electrode, and the at least one sixth electrode comprises a plate-shaped structure.

10. The substrate processing apparatus of claim 1, wherein the second electrode of the first electrode group and the fourth electrode of the second electrode group are arranged adjacent to the at least one third electrode, and
an interval between the at least one third electrode and the second electrode is equal to that between the at least one third electrode and the fourth electrode.

11. The substrate processing apparatus of claim 1, wherein each of the first electrode, the second electrode, the at least one third electrode, the fourth electrode, the fifth electrode, and the at least one sixth electrode is arranged in a direction in which a plurality of substrates comprising the substrate are stacked and accommodated in the process chamber.

12. The substrate processing apparatus of claim 1, wherein a plurality of substrates comprising the substrate are stacked and accommodated in the process chamber, and
a front end of the second electrode is located at a position lower than a position of an uppermost substrate among the plurality of substrates by a length within a range from 0.5% to 6% with respect to an output wavelength of a high frequency power supply applied thereto.

13. The substrate processing apparatus of claim 1, wherein the first electrode group and the second electrode group are provided outside the process chamber, and are configured to generate the plasma within the process chamber.

14. The substrate processing apparatus of claim 1, wherein the first electrode, the second electrode, the at least one third electrode, the fourth electrode, the fifth electrode, and the at least one sixth electrode are adjacently arranged at an equal interval.

15. The substrate processing apparatus of claim 1, wherein the first electrode group and the second electrode group are arranged adjacent to each other.

16. The substrate processing apparatus of claim 1, wherein the second electrode of the first electrode group and the fourth electrode of the second electrode group are arranged adjacent to the at least one third electrode, and
a length of the second electrode and a length of the fourth electrode are different from each other.

17. The substrate processing apparatus of claim 1, wherein a length of the first electrode, a length of the at least one third electrode, a length of the fourth electrode arranged adjacent to the at least one third electrode, and a length of the at least one sixth electrode are equal to one another.

18. The substrate processing apparatus of claim 1, wherein a plurality of substrates comprising the substrate are stacked and accommodated in the process chamber, and
a front end of the fifth electrode is located at a position lower than a position of an uppermost substrate among the plurality of substrates by a length within a range from 0.5% to 6% with respect to an output wavelength of a high frequency power supply applied thereto.

19. An electrode structure capable of generating a plasma, the electrode structure comprising:
a first electrode group constituted by: a first electrode to which an electric potential is applied; a second electrode to which an electric potential is applied; and at least one third electrode to which a reference potential is applied, wherein the first electrode, the second electrode, and the at least one third electrode are sequentially arranged in aforelisted order, and the first electrode and the second electrode arranged adjacent to each other have different lengths from each other; and
a second electrode group constituted by: a fourth electrode to which an electric potential is applied; a fifth electrode to which an electric potential is applied; and at least one sixth electrode to which the reference potential is applied, wherein the fourth electrode, the fifth electrode, and the at least one sixth electrode are sequentially arranged in aforelisted order, and the fourth electrode and the fifth electrode arranged adjacent to each other have different lengths from each other.

20. A method of manufacturing a semiconductor device, comprising:
(a) loading a substrate into a process chamber, where the substrate is processed, of a substrate processing apparatus provided with a plasma generator comprising an electrode structure capable of generating a plasma, wherein the electrode structure comprises:
a first electrode group constituted by: a first electrode to which an electric potential is applied; a second electrode to which an electric potential is applied; and at least one third electrode to which a reference potential is applied, wherein the first electrode, the second electrode, and the at least one third electrode are sequentially arranged in aforelisted order, and the first electrode and the second electrode arranged adjacent to each other have different lengths from each other; and
a second electrode group constituted by: a fourth electrode to which an electric potential is applied; a fifth electrode to which an electric potential is applied; and at least one sixth electrode to which the reference potential is applied, wherein the fourth electrode, the fifth electrode, and the at least one sixth electrode are sequentially arranged in aforelisted order, and the fourth electrode and the fifth electrode arranged adjacent to each other have different lengths from each other; and (b) generating the plasma within the process chamber by the plasma generator.

* * * * *